(12) United States Patent
Ohshima et al.

(10) Patent No.: US 11,280,808 B2
(45) Date of Patent: Mar. 22, 2022

(54) IC SOCKET

(71) Applicant: ENPLAS CORPORATION, Saitama (JP)

(72) Inventors: Hisao Ohshima, Saitama (JP); Yasushige Komatsu, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 16/972,816

(22) PCT Filed: May 21, 2019

(86) PCT No.: PCT/JP2019/020040
§ 371 (c)(1),
(2) Date: Dec. 7, 2020

(87) PCT Pub. No.: WO2019/235207
PCT Pub. Date: Dec. 12, 2019

(65) Prior Publication Data
US 2021/0247421 A1   Aug. 12, 2021

(30) Foreign Application Priority Data
Jun. 8, 2018   (JP) .............................. JP2018-110442

(51) Int. Cl.
*G01R 1/073* (2006.01)
*G01R 1/04* (2006.01)
(Continued)

(52) U.S. Cl.
CPC ........... *G01R 1/073* (2013.01); *G01R 1/0433* (2013.01); *G01R 1/06722* (2013.01); *H01R 13/24* (2013.01); *H01R 33/76* (2013.01)

(58) Field of Classification Search
CPC .. G01R 1/073; G01R 1/06722; G01R 1/0433; H01R 13/24; H01R 33/76
See application file for complete search history.

(56) References Cited

U.S. PATENT DOCUMENTS

2013/0257467 A1   10/2013   Tomioka
2014/0162503 A1*  6/2014    Yamada ............... H01R 4/4863
                                              439/786

FOREIGN PATENT DOCUMENTS

JP   2010-38837     2/2010
JP   2012-117845    6/2012
(Continued)

OTHER PUBLICATIONS

International Search Report dated Jul. 16, 2019 in International (PCT) Application No. PCT/JP2019/020040.

*Primary Examiner* — Paresh Patel
(74) *Attorney, Agent, or Firm* — Wenderoth, Lind & Ponack, L.L.P.

(57) ABSTRACT

A plunger of the probe has a slider portion engaged with a plunger guide hole formed in a socket body, which is prevented from rotating, and first and second positioning surfaces having different vertical positions along a central axis of the probe by cutting two places of a rounded bar member in a radial direction. The probe receptacle has a first abutting protrusion on which the first positioning surface is abuttable and a second abutting protrusion on which the second positioning surface is abuttable when the probe is inserted in a correct posture. When the plunger is inserted in an erroneous posture, the first positioning surface abuts on the second abutting protrusion to prevent the plunger from projecting from the plunger guide hole or project the plunger by an amount less than the design dimension.

5 Claims, 20 Drawing Sheets

(51) Int. Cl.
    *G01R 1/067*     (2006.01)
    *H01R 13/24*     (2006.01)
    *H01R 33/76*     (2006.01)

(56) References Cited

FOREIGN PATENT DOCUMENTS

| | | |
|---|---|---|
| JP | 5131766 | 1/2013 |
| JP | 2014-25789 | 2/2014 |

\* cited by examiner

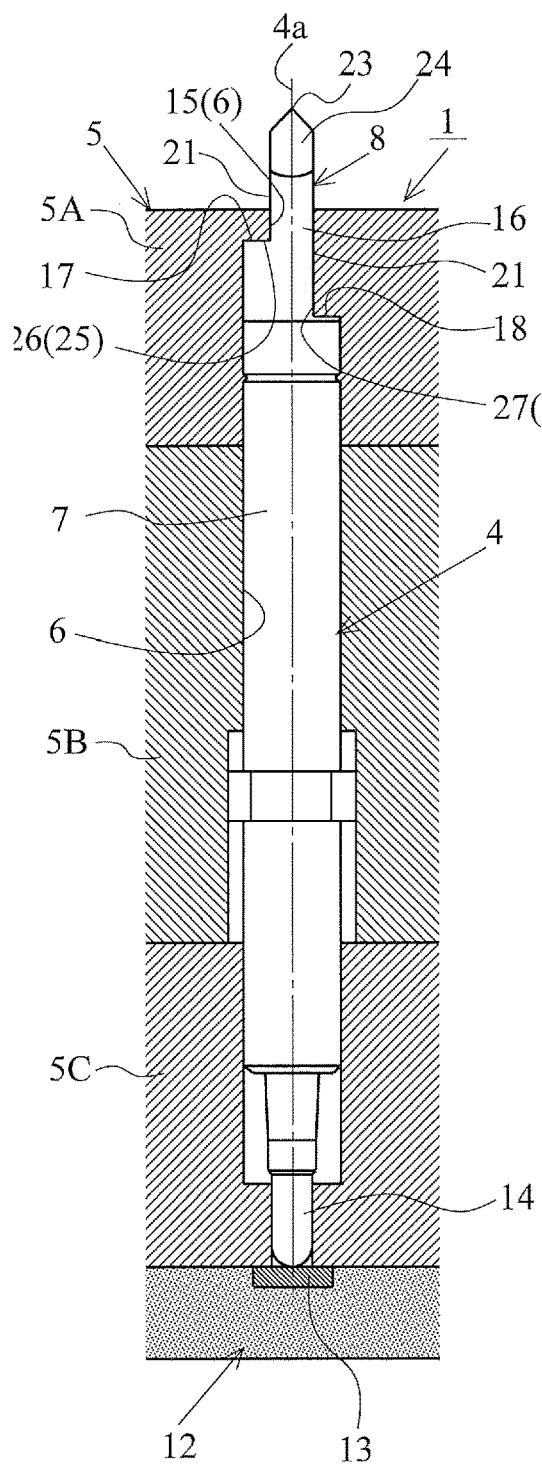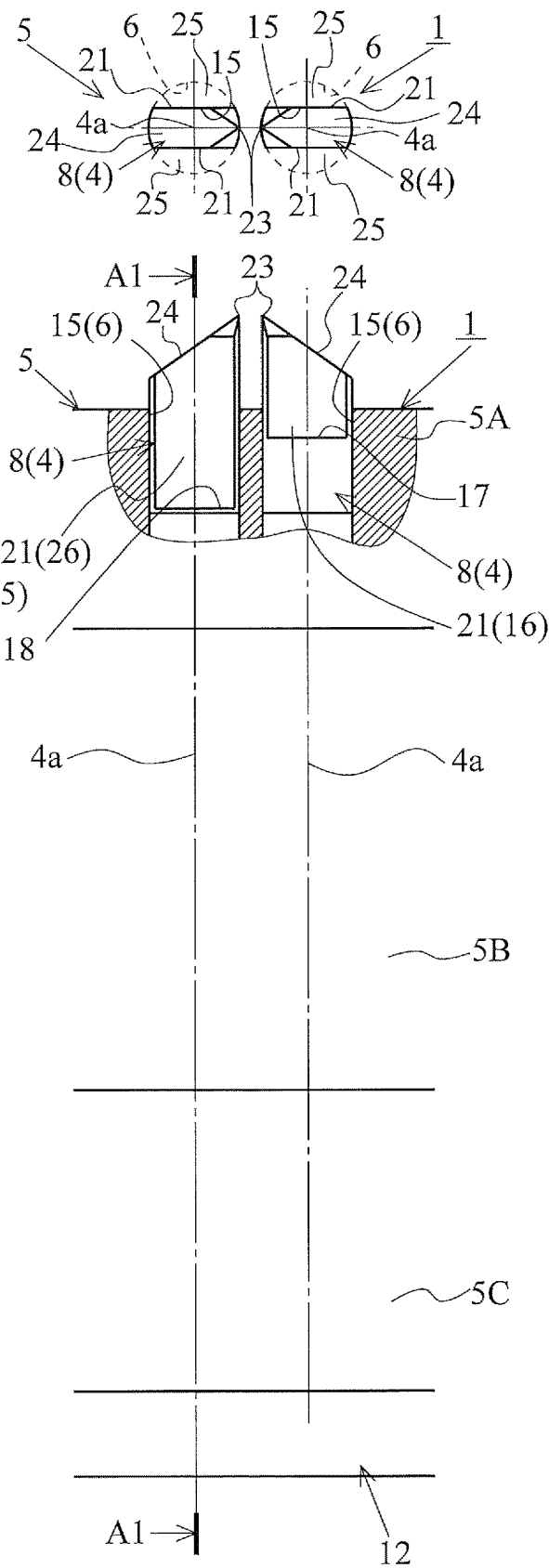
Fig. 1C
Fig. 1A
Fig. 1B

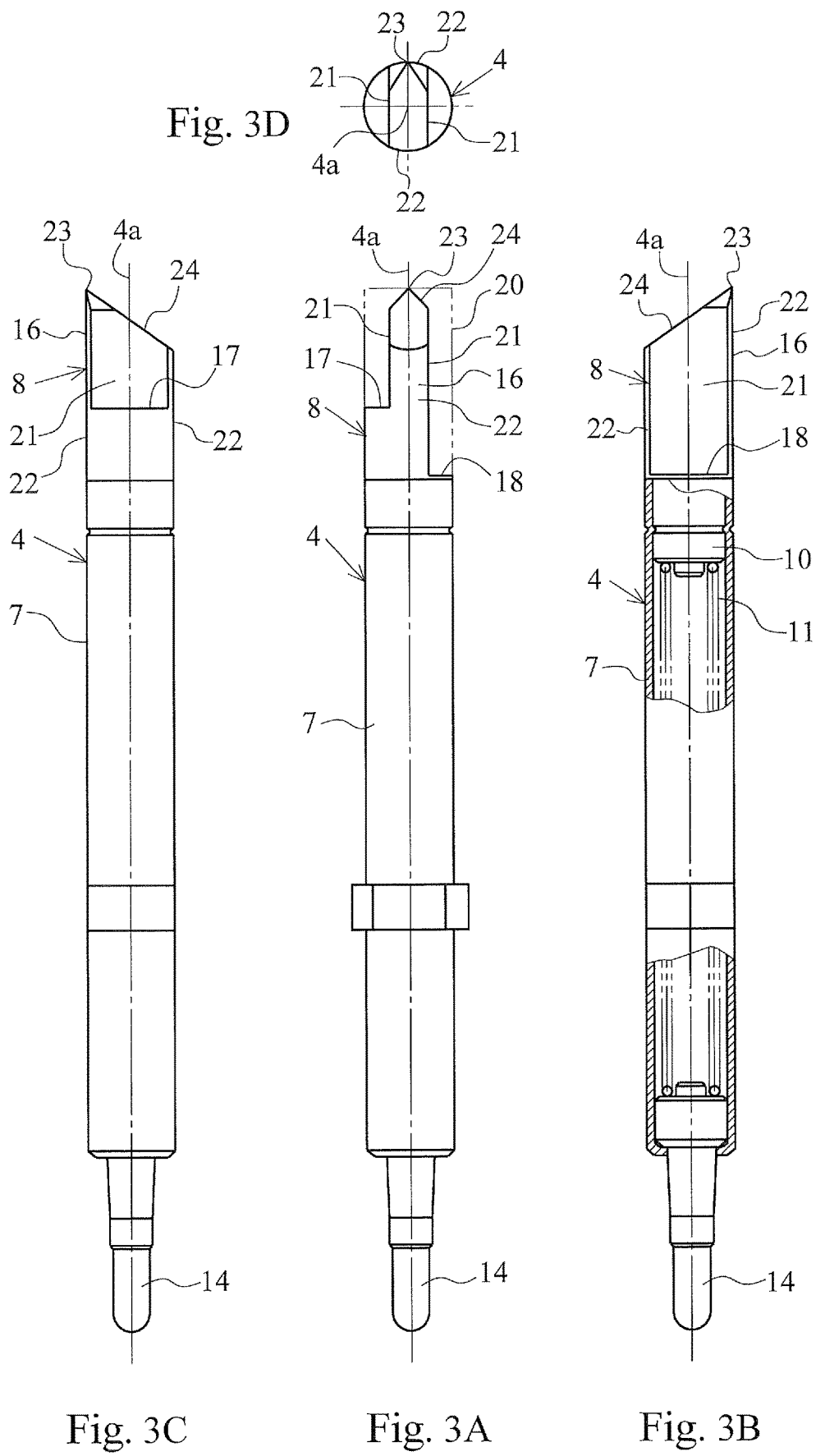

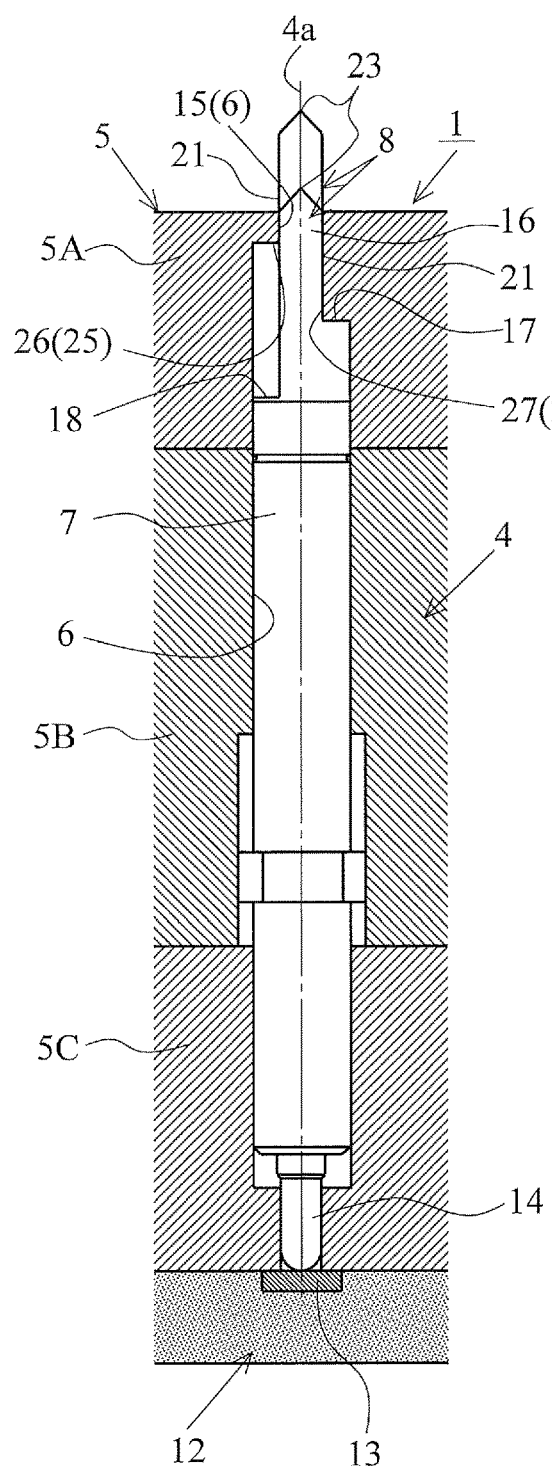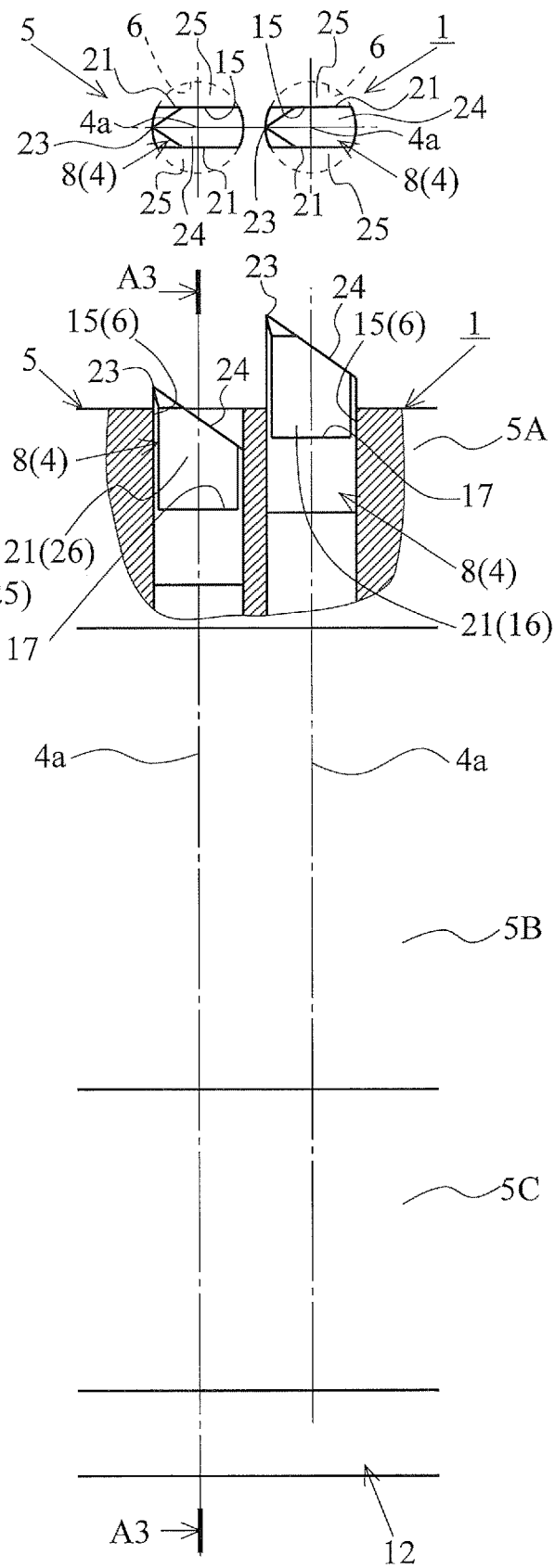
Fig. 4C
Fig. 4A
Fig. 4B

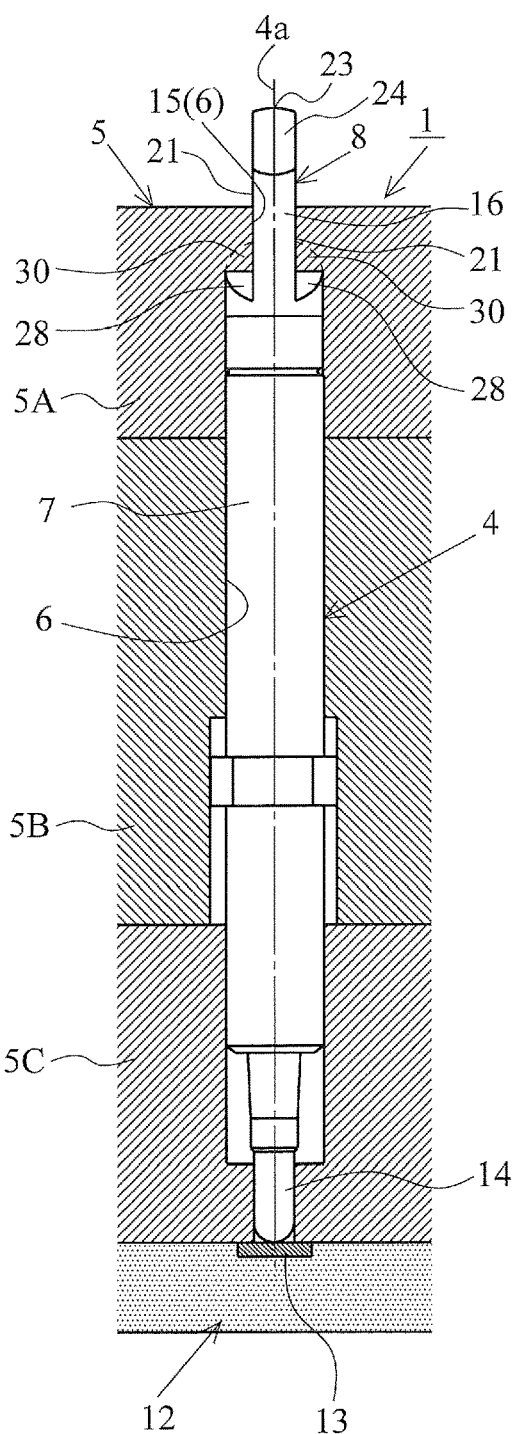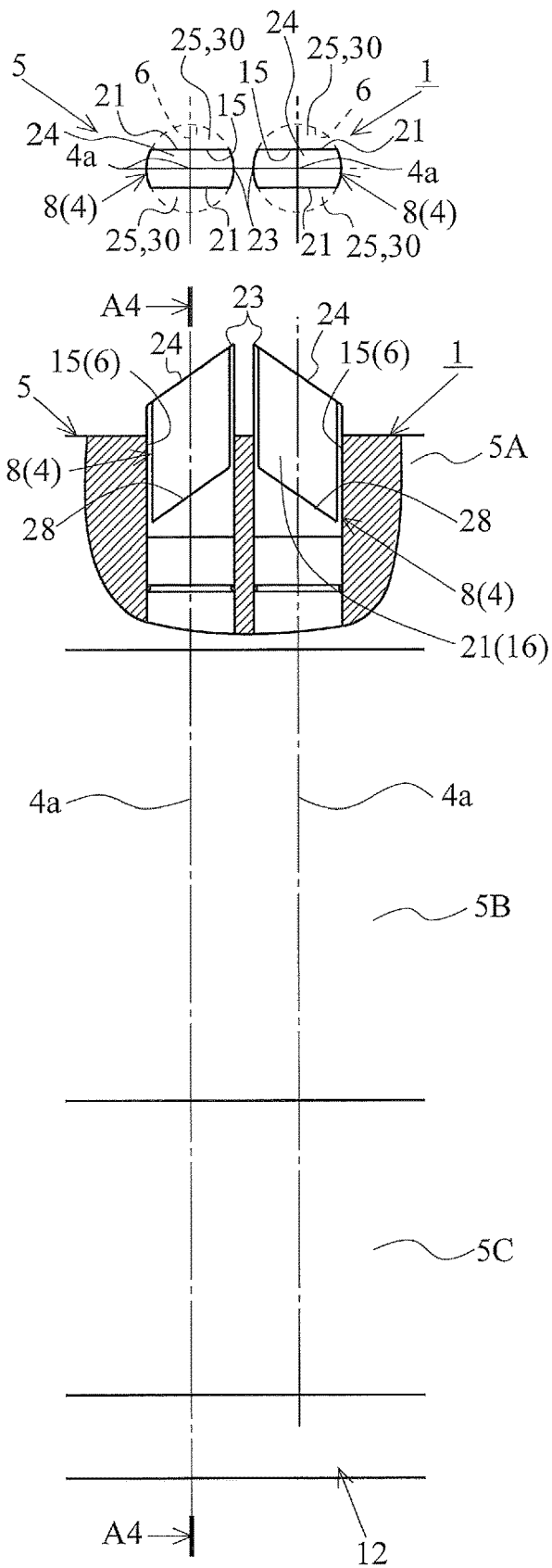
Fig. 6C
Fig. 6A
Fig. 6B

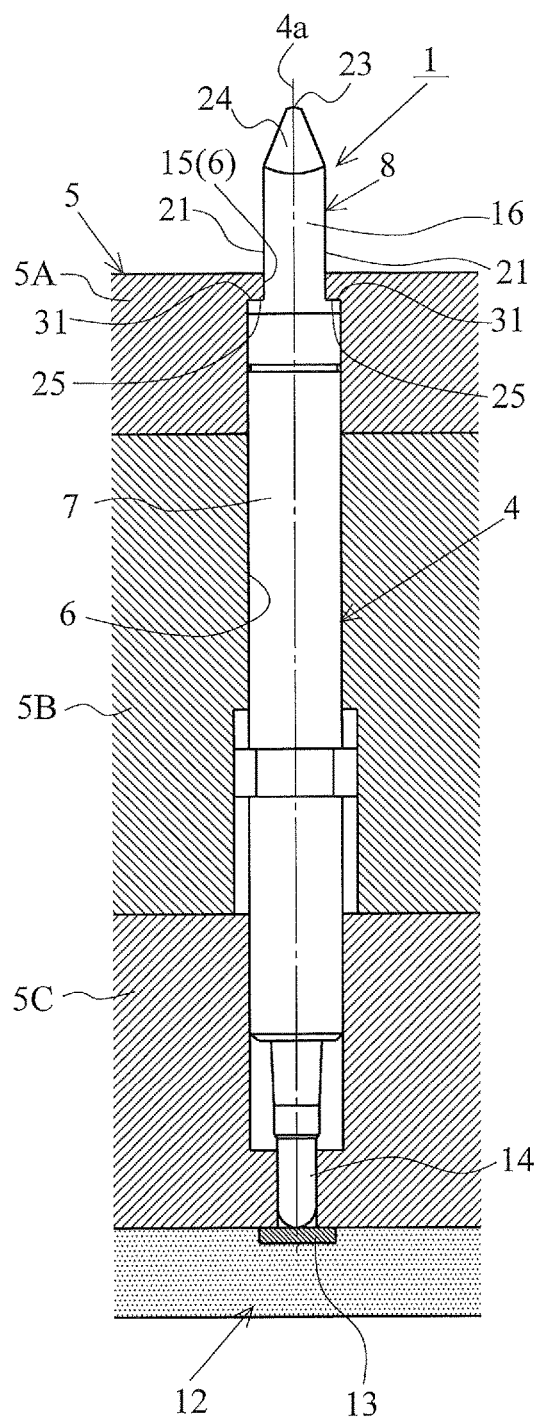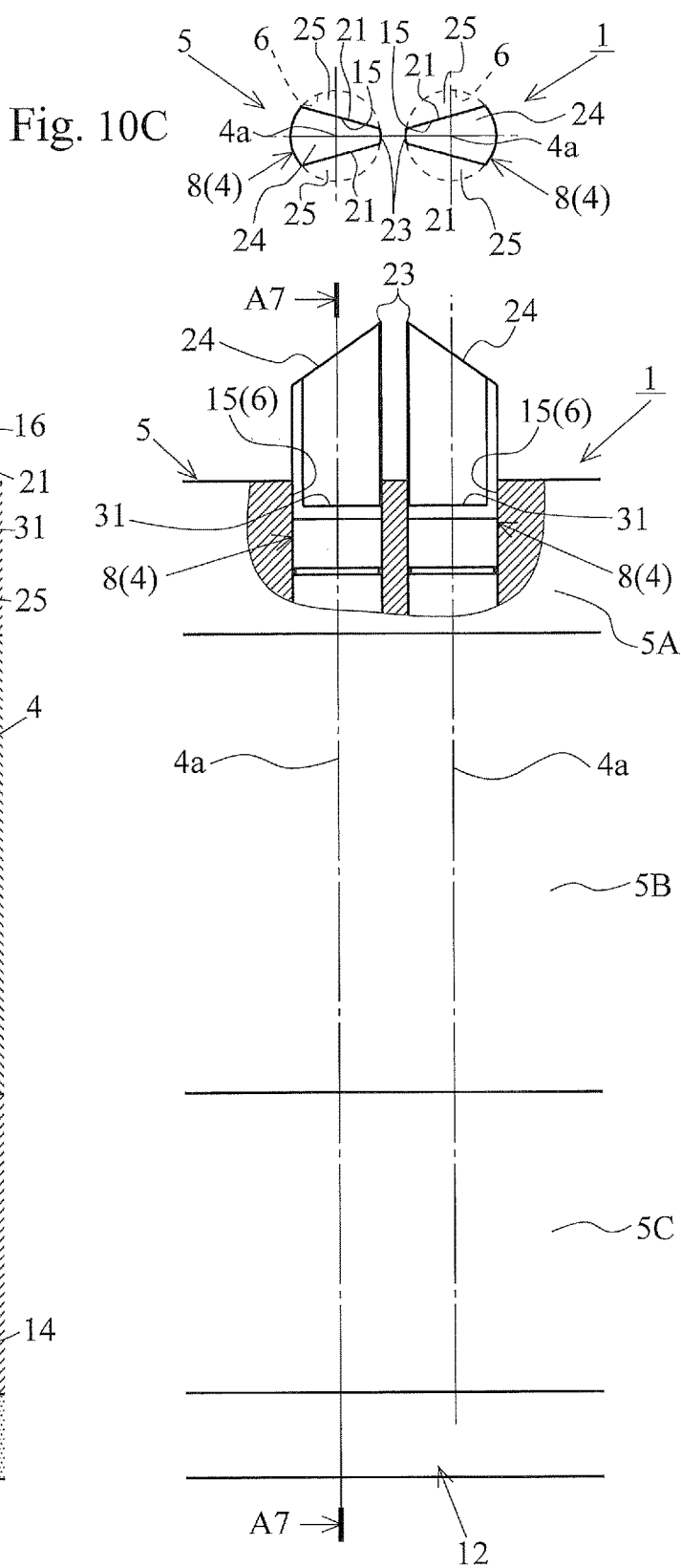
Fig. 10C
Fig. 10A
Fig. 10B

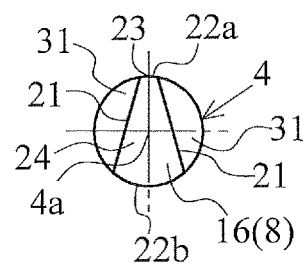
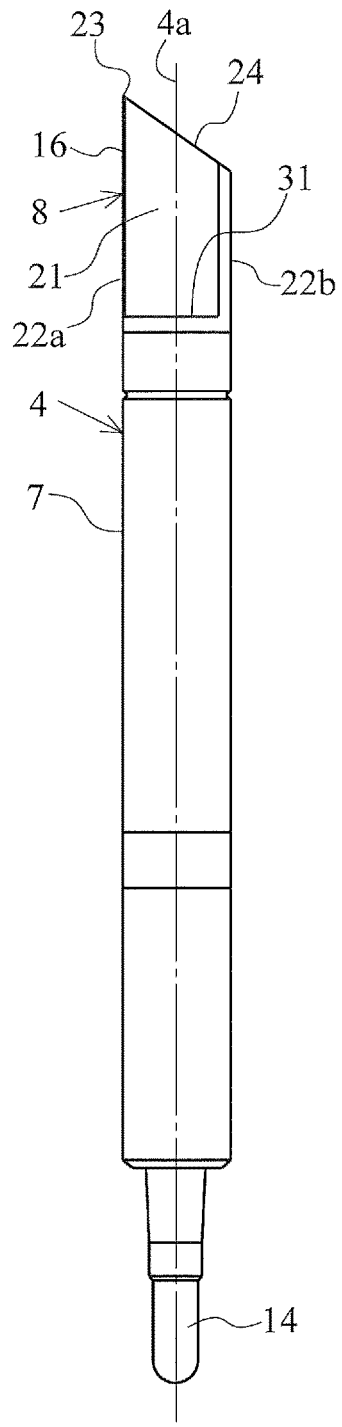
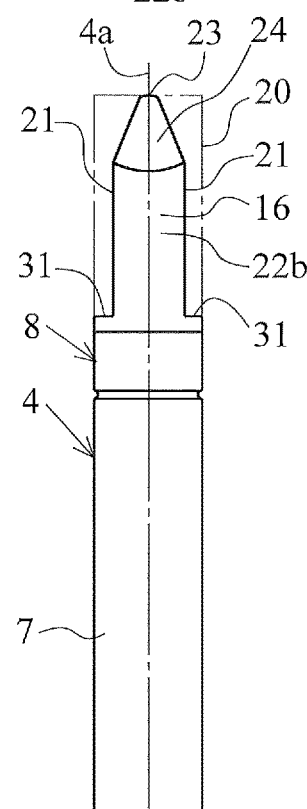
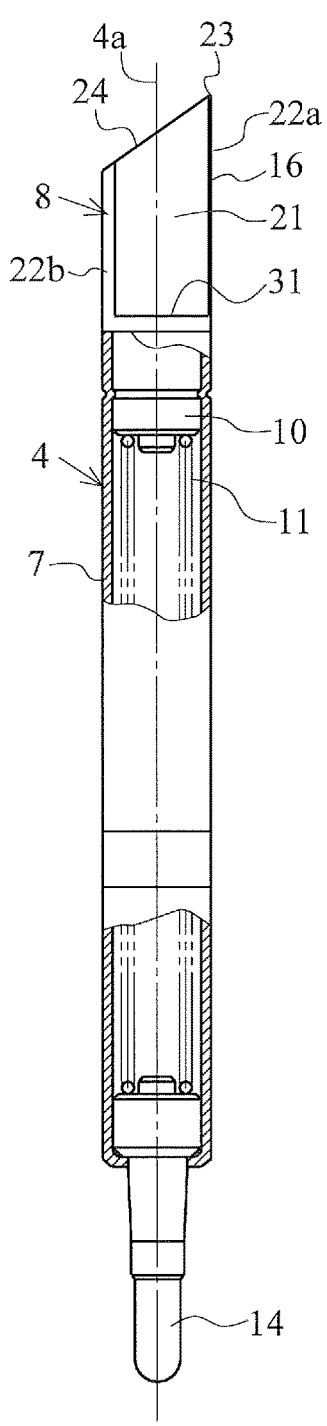
Fig. 11D
Fig. 11C  Fig. 11A  Fig. 11B

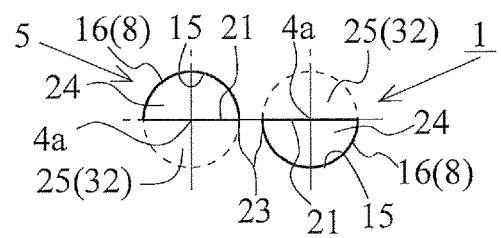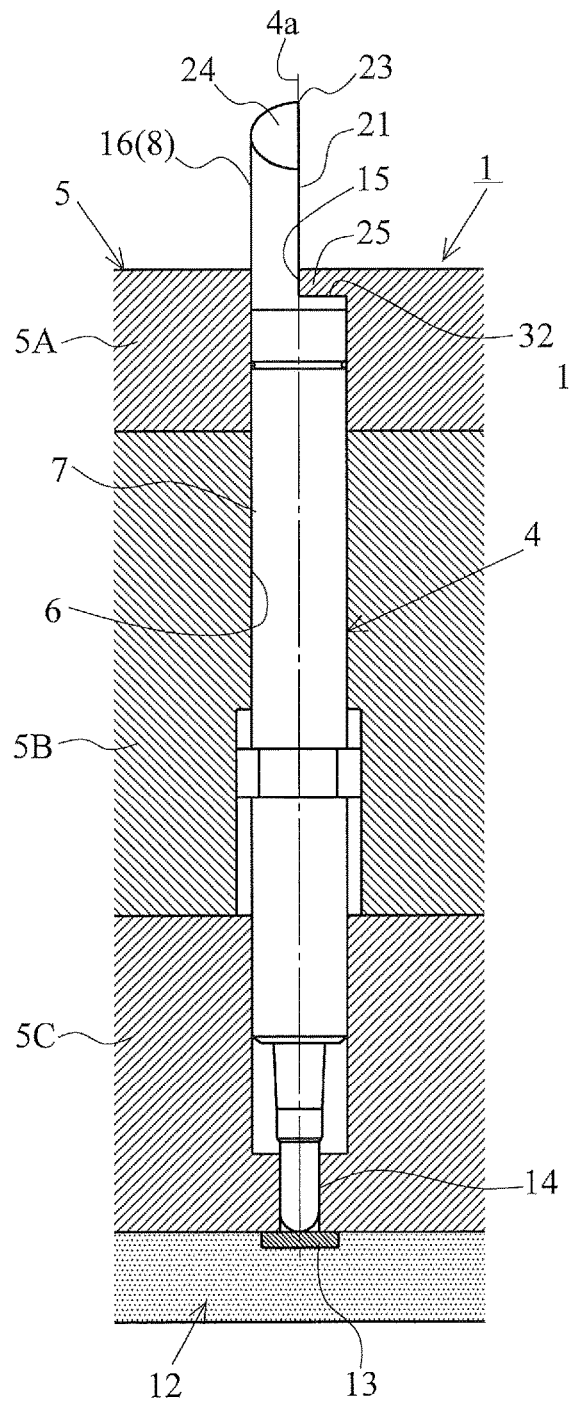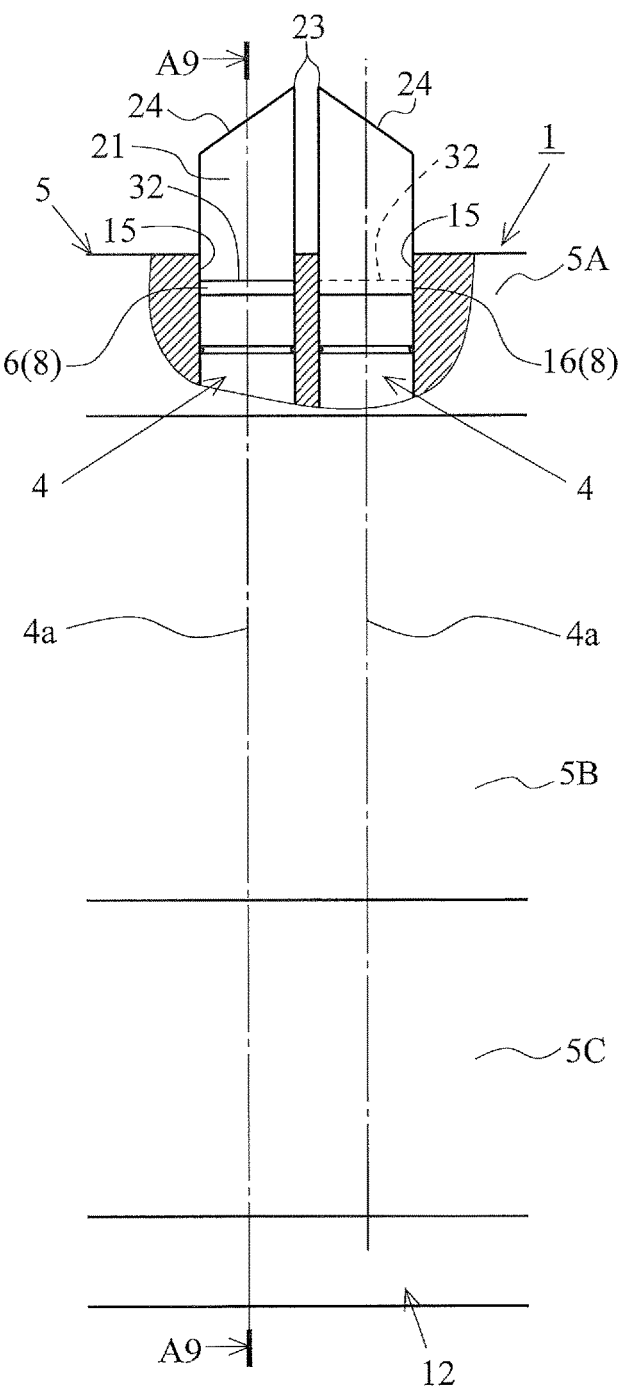
Fig. 13A    Fig. 13B

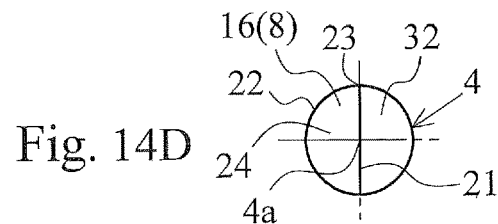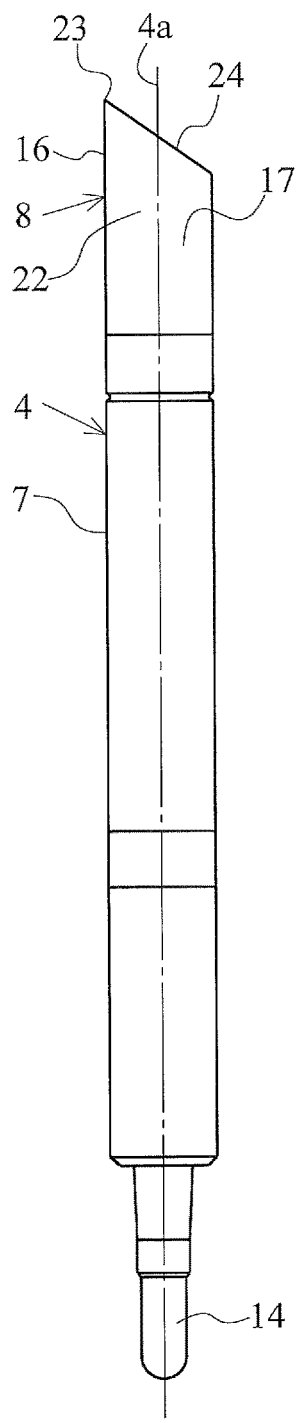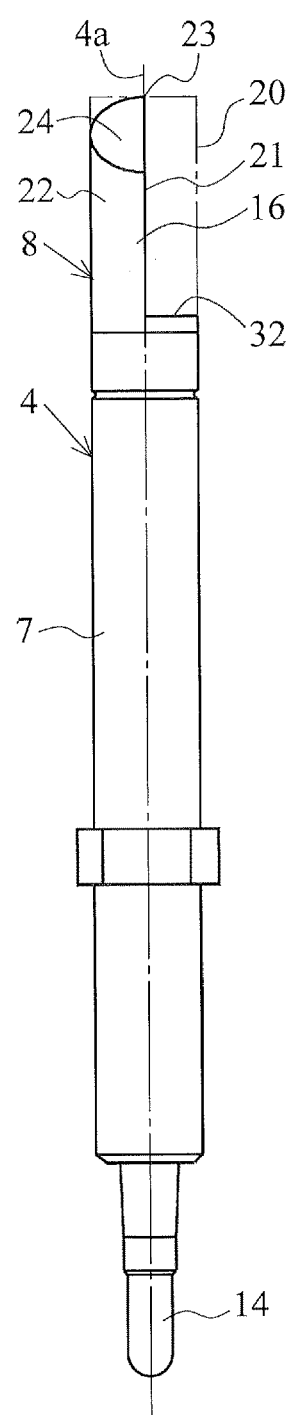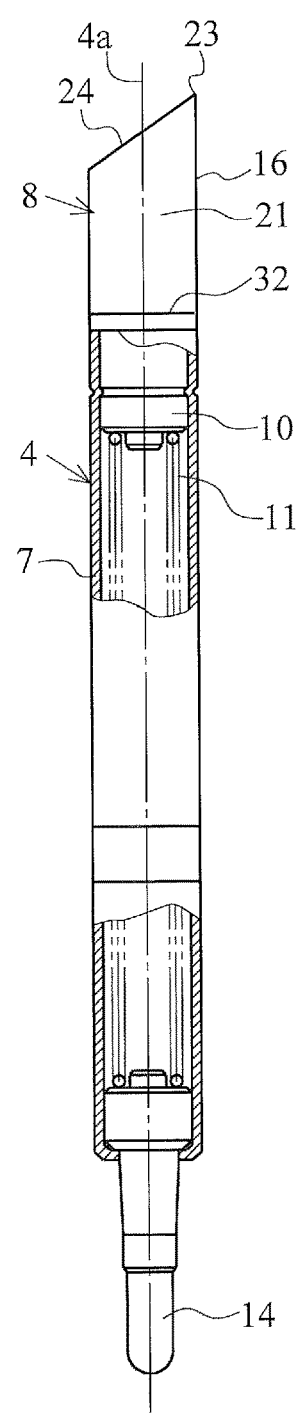
Fig. 14D
Fig. 14C   Fig. 14A   Fig. 14B

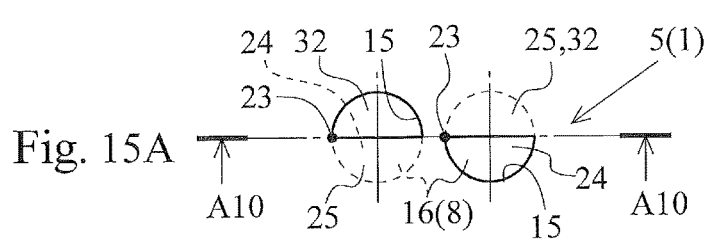
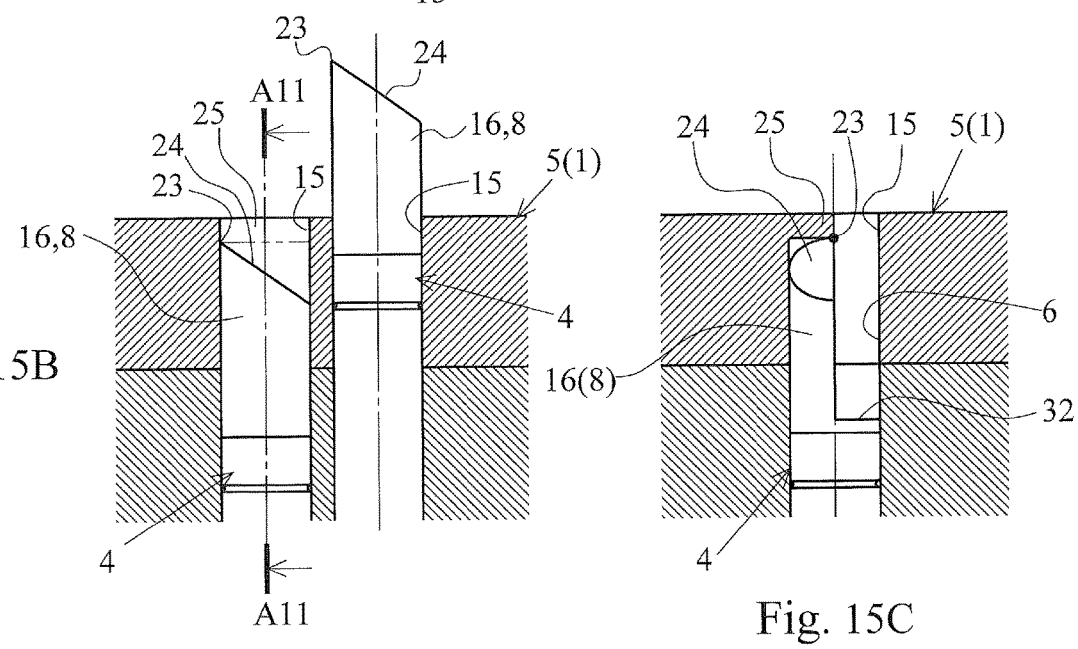
Fig. 15A
Fig. 15B
Fig. 15C

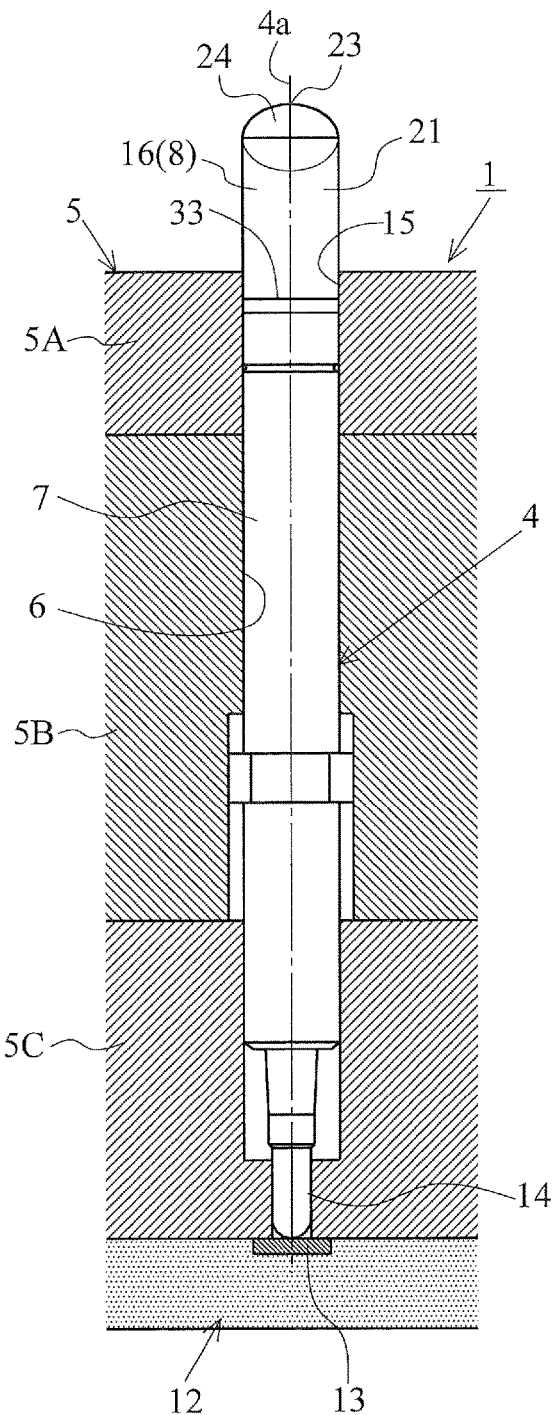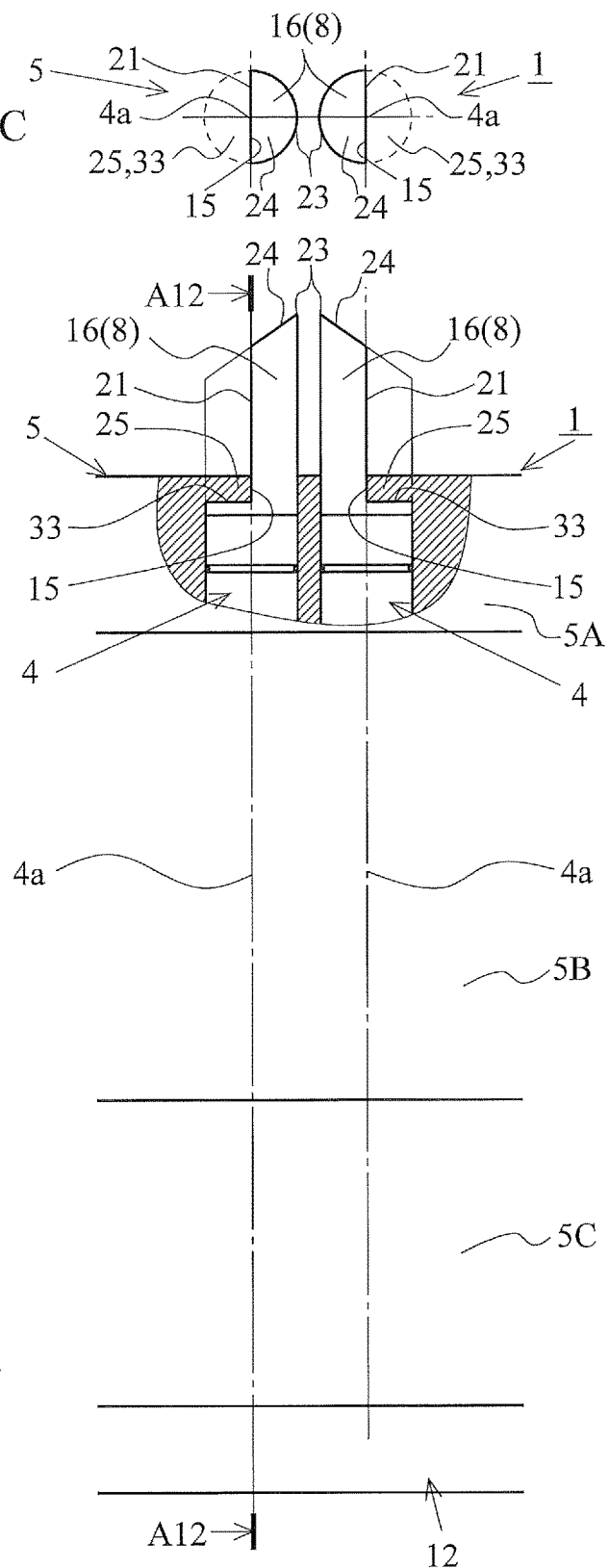
Fig. 16A  Fig. 16B  Fig. 16C

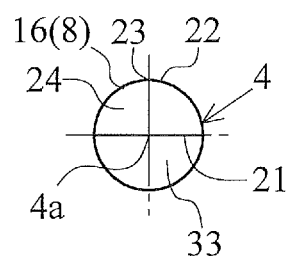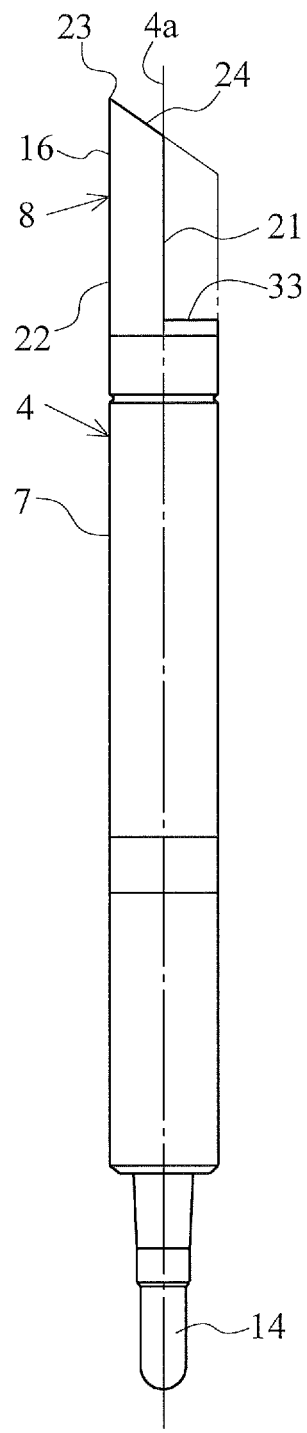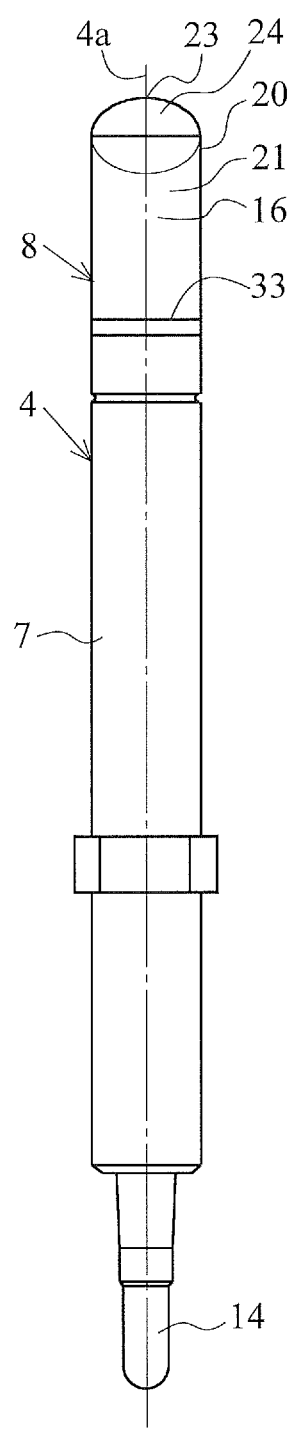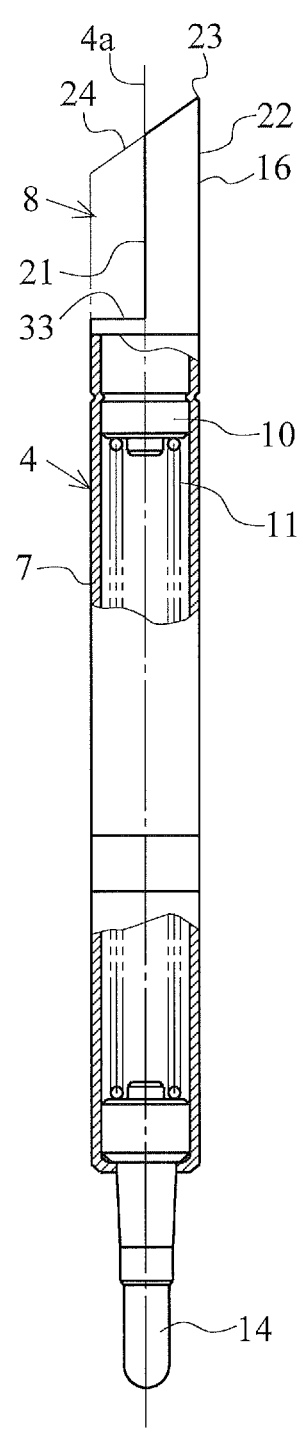

IC SOCKET

TECHNICAL FIELD

The present invention relates to an IC socket used in an electrical test for an electronic component.

BACKGROUND ART

For example, a QFP (Quad Flat Package), which is a type of semiconductor package for electronic components, has a square outer shape in many cases, and has a plurality of connection terminals protruding from all four sides, so that a pitch between the connection terminals has been reduced more and more.

FIG. 19 is a diagram illustrating a Kelvin inspection IC socket 101 of the prior art used in an electrical test for such an electronic component 100. Note that FIG. 19A is a diagram illustrating the Kelvin inspection IC socket 101 of the prior art to show a state of the electronic component 100 before the electric test. In addition, FIG. 19B is a diagram illustrating a Kelvin inspection IC socket 101 of the prior art at the time of the electrical test for the electronic component 100.

As illustrated in FIG. 19, in the Kelvin inspection IC socket 101, a pair of probes 103 coining into contact with terminals 102 of the electronic component 100 are arranged as many as the number of terminals 102, and the probes 103 are respectively housed in probe receptacles 105 provided in the socket body 104 formed of an insulating resin material. Note that one of the pair of probes 103 is a force contact probe for supplying an electric current, and the other probe 103 is a sense contact probe for monitoring a voltage.

As illustrated in FIG. 19, in the Kelvin inspection IC socket 101 of the prior art, in order to reliably connect a pair of probes 103 to small terminals 102 of the electronic component 100 (including electrodes formed of solder balls or the like), the pair of probes 103 are assembled to the probe receptacles 105 of the socket body 104 formed of an insulating material in a back-to-back manner such that vertex portions 107 (portions contacting the terminal 102) of the plungers 106 of the pair of probes 103 are closest to each other while the pair of probes 103 are prevented from rotating with respect to the socket body 104.

As illustrated in FIGS. 19 to 21, in the Kelvin inspection IC socket 101 of the prior art, a tip-side body portion 108 of the plunger 106 is offset with respect to a central axis 105a of the probe receptacle 105 in order to prevent the pair of probes 103 from being assembled to the socket body 104 erroneously in the same posture (one of the pair of probes 103 placed back to back is rotated by 180° with respect to the other probe 103).

Specifically, as illustrated in FIGS. 20B and 21, the tip-side body portion 108 of the plunger 106 has a substantially rectangular shape as seen in a plan view, and is engaged with a plunger guide hole 110 provided in the socket body 104 in a substantially rectangular shape when the probe 103 is assembled to the probe receptacle 105 of the socket body 104 in a correct posture. However, as illustrated in FIG. 22, when the probe 103 is assembled in an erroneous posture (in a posture rotated by 180° from the correct posture), the vertex portion 107 of the plunger 106 is caught in a stepped portion 111 between the probe receptacle 105 and the plunger guide hole 110, and the plunger 106 cannot be engaged with the plunger guide hole 110, so that the probe 103 is prevented from being erroneously assembled to the socket body 104 in advance (see Patent Document 1).

CITATION LIST

Patent Documents

Patent Document 1: Japanese Patent No. 5131766

SUMMARY OF INVENTION

Problems to be Solved by the Invention

However, in the Kelvin inspection IC socket 101 of the prior art, as illustrated in FIG. 20, when the tip-side body portion 108 of the plunger 106 is formed, three places of first to third regions of a rounded bar member 113 having the same diameter as that of a flange portion 112 of the plunger 106 are cut out through machining to form a pair of parallel side surfaces 115 and a side surface (flat surface) 116 perpendicular to the pair of parallel side surfaces 115. Therefore, there are many machining places in the plunger 106, and this increases a fabrication cost of the plunger 106 disadvantageously.

In this regard, an object of the present invention is to provide an IC socket capable of preventing the probe from being erroneously assembled to the socket body even when the fabrication workload for the side surface of the plunger is reduced.

Means for Solving the Problems

The present invention relates to an IC socket 1 used in an electrical test for an electronic component 2. The IC socket 1 according to the present invention includes a probe 4 configured to contact a terminal 3 of the electronic component 2 and a socket body 5 having a probe receptacle 6 formed to house the probe 4. The probe 4 includes a tube 7 housed in the probe receptacle 6 of the socket body 5, and a plunger 8 assembled to one end side of the tube 7 and biased by a spring member 11 housed in the tube 7 such that a tip contacts the terminal 3 of the electronic component 2. The plunger 8 has a slider portion 16 slidably engaged with a plunger guide hole 15 formed in the socket body 5. The slider portion is prevented from rotating. The plunger guide hole 15 is formed in a plunger guide portion 25 placed to block one end side of the probe receptacle 6 to form a part of the probe receptacle 6. The slider portion 16 has one side surface 21 formed by cutting a rounded bar member 20 from one end side of a radial direction toward a center side, the one side surface 21 extending from a tip 23 side of the plunger 8 along a central axis 4a of the probe 4, or a pair of side surfaces 21 formed by cutting the rounded bar member 20 from one end side of the radial direction and the other end side of the radial direction toward the center side, the pair of side surfaces 21 extending from a tip 23 side of the plunger 8 along the central axis 4a of the probe 4. The one side surface 21 of the slider portion 16 or the pair of side surfaces 21 of the slider portion 16 are engaged with the plunger guide hole 15. In addition, the socket body 5 has a plunger projection amount restrictor 25, 26, 27, and 30 that abuts on the plunger 8 to project the plunger 8 from the plunger guide hole 15 by a design dimension when the probe 4 is inserted into the probe receptacle 6 in the correct posture or abuts on the plunger 8 to prevent the plunger 8 from projecting from the plunger guide hole 15 or projects the plunger 8 by an amount less than the design dimension when the probe 4 is inserted into the probe receptacle 6 in an erroneous posture.

Advantageous Effects

The IC socket according to the present invention has one or two machining places on the side surface of the plunger, as compared with the example of the prior art in which three places are machined on the side surface of the plunger. Therefore, it is possible to prevent the probe from being erroneously assembled to the probe receptacle of the socket body even when the fabrication workload for the side surface of the plunger is reduced. Using the IC socket according to the present invention described above, the fabrication workload for the side surface of the plunger is reduced. As a result, it is possible to reduce the fabrication cost.

BRIEF DESCRIPTION OF DRAWINGS

FIG. 1 is a diagram illustrating a Kelvin inspection IC socket according to a first embodiment of the present invention, in which FIG. 1A is a partial cross-sectional view illustrating the Kelvin inspection IC socket (cross-sectional view taken along the line A1-A1 of FIG. 1B), FIG. 1B is a partial front view illustrating the Kelvin inspection IC socket by partially cutting it away, and FIG. 1C is a partial plan view of the Kelvin inspection IC socket.

FIG. 2 is a diagram illustrating a simplified relationship between the Kelvin inspection IC socket according to a first embodiment of the present invention and an electronic component, in which

FIG. 3 is a diagram illustrating a probe of the Kelvin inspection IC socket according to a first embodiment of the present invention, in which FIG. 3A is a front view illustrating the probe, FIG. 3B is a right-side view illustrating the probe by partially cutting them away, FIG. 3C is a left-side view of the probe, and FIG. 3D is a plan view of the probe.

FIG. 4 is a diagram illustrating an erroneous probe insertion state of the Kelvin inspection IC socket according to the first embodiment of the invention, in which FIG. 4A is a partial cross-sectional view illustrating an erroneous probe insertion state of the Kelvin inspection IC socket (cross-sectional view taken along the line A3-A3 of FIG. 4B), FIG. 4B is a partial front view illustrating an erroneous probe insertion state of the Kelvin inspection IC socket by partially cutting it away, and FIG. 4C is a partial plan view illustrating an erroneous probe insertion state of the Kelvin inspection IC socket.

FIG. 5 is a diagram illustrating an assembled state of the Kelvin inspection IC socket, in which

FIG. 6 is a diagram illustrating a Kelvin inspection IC socket according to a second embodiment of the present invention, in which FIG. 6A is a partial cross-sectional view of the Kelvin inspection IC socket (cross-sectional view taken along the line A4-A4 of FIG. 6B), FIG. 6B is a partial front view illustrating the Kelvin inspection IC socket by partially cutting it away, and FIG. 6C is a partial plan view of the Kelvin inspection IC socket.

FIG. 7 is a diagram illustrating a probe of the Kelvin inspection IC socket according to a second embodiment of the present invention, in which FIG. 7B is a right-side view illustrating the probe by partially cutting it away.

FIG. 8 is a diagram illustrating one end side of the probe receptacle of the Kelvin inspection IC socket according to the second embodiment of the present invention, in which

FIG. 9 is a diagram illustrating an erroneous probe insertion state of the Kelvin inspection IC socket according to the second embodiment of the present invention, in which

FIG. 10 is a diagram illustrating a Kelvin inspection IC socket according to a third embodiment of the present invention, in which FIG. 10A is a partial cross-sectional view illustrating the Kelvin inspection IC socket (cross-sectional view taken along the line A7-A7 of FIG. 10B), FIG. 10B is a partial front view illustrating the Kelvin inspection IC socket by partially cutting it away, and FIG. 10C is a partial plan view of the Kelvin inspection IC socket.

FIG. 11 is a diagram illustrating a probe of the Kelvin inspection IC socket according to the third embodiment of the present invention, in which FIG. 11A is a front view of the probe, FIG. 11B is a right-side view illustrating the probe by partially cutting it away, FIG. 11C is a left-side view of the probe, and FIG. 11D is a plan view of the probe.

FIG. 12 is a diagram illustrating an erroneous probe insertion state of the Kelvin inspection IC socket according to the third embodiment of the present invention, in which

FIG. 13 is a diagram illustrating a Kelvin inspection IC socket according to a fourth embodiment of the present invention, in which FIG. 13A is a partial cross-sectional view illustrating the Kelvin inspection IC socket (cross-sectional view taken along the line A9-A9 of FIG. 13B), FIG. 13B is a partial front view illustrating the Kelvin inspection IC socket by partially cutting it away, and FIG. 13C is a partial plan view of the Kelvin inspection IC socket.

FIG. 14 is a diagram illustrating a probe of the Kelvin inspection IC socket according to the fourth embodiment of the present invention, in which FIG. 14A is a front view of the probe, FIG. 14B is a right-side view illustrating the probe by partially cutting it away, FIG. 14C is a left-side view of the probe, and FIG. 14D is a plan view of the probe.

FIG. 15 is a diagram illustrating an erroneous probe insertion state of the Kelvin inspection IC socket according to the fourth embodiment of the present invention, in which FIG. 15A is a partial plan view illustrating an erroneous probe insertion state of the Kelvin inspection IC socket, FIG. 15B is a cross-sectional view illustrating the Kelvin inspection IC socket taken along the line A10-A10 of FIG. 15A, and FIG. 15C is a cross-sectional view illustrating the Kelvin inspection IC socket taken along the line A11-A11 of FIG. 15B.

FIG. 16 is a diagram illustrating a Kelvin inspection IC socket according to a fifth embodiment of the present invention, in which FIG. 16A is a partial cross-sectional view illustrating the Kelvin inspection IC socket (cross-sectional view taken along the line A12-A12 of FIG. 16B), FIG. 16B is a partial front view illustrating the Kelvin inspection IC socket by partially cutting it away, and FIG. 16C is a partial plan view of the Kelvin inspection IC socket.

FIG. 17 is a diagram illustrating a probe of the Kelvin inspection IC socket according to the fifth embodiment of the present invention, in which FIG. 17A is a front view of the probe, FIG. 17C is a left-side view of the probe, and FIG. 17D is a plan view of the probe.

FIG. 18 is a diagram illustrating an erroneous probe insertion state of the Kelvin inspection IC socket according to the fifth embodiment of the present invention, in which

FIG. 20 is a diagram illustrating a probe of the Kelvin inspection IC socket in an example of the prior art, in which

DESCRIPTION OF EMBODIMENTS

A Kelvin inspection IC socket according to embodiments of the present invention will now be described with reference to the accompanying drawings.

First Embodiment

Figure 2A:
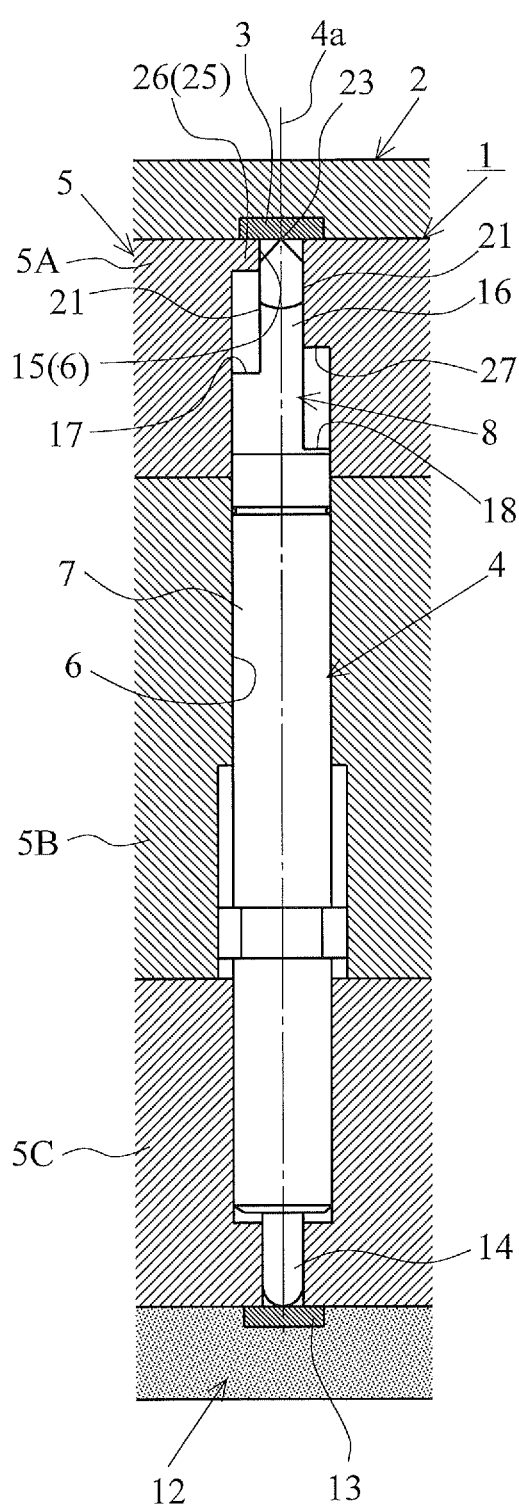
FIG. 2A is a partial cross-sectional view illustrating the Kelvin inspection IC socket and the electronic component (cross-sectional view taken along the line A2-A2 of FIG. 2B)
Figure 2B:
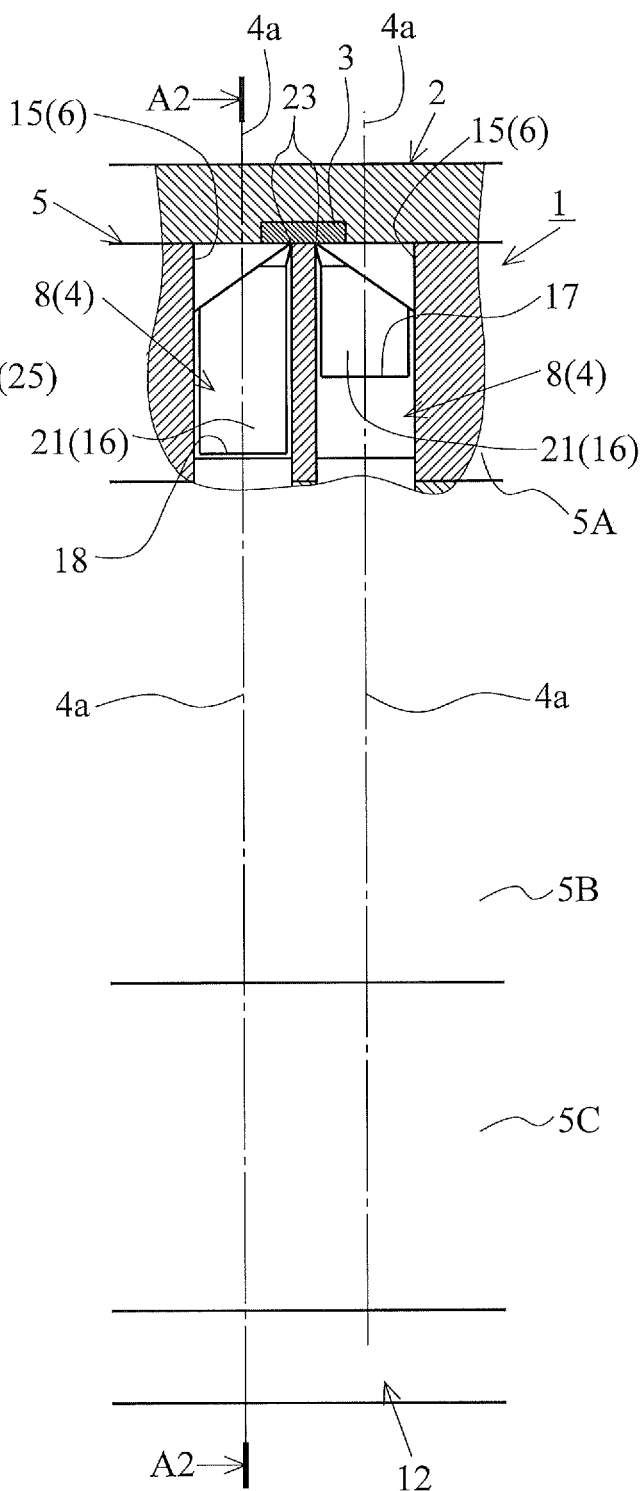
FIG. 2B is a partial front view illustrating the Kelvin inspection IC socket and the electronic component by partially cutting them away.

FIG. 1 is a diagram illustrating a Kelvin inspection IC socket 1 according to a first embodiment of the present invention. In addition, FIG. 2 is a diagram illustrating a simplified relationship between the Kelvin inspection IC socket 1 according to the first embodiment of the present invention and an electronic component 2. Note that FIG. 1A is a partial cross-sectional view illustrating the Kelvin inspection IC socket 1 (cross-sectional view taken along the line A1-A1 of FIG. 1B). In addition, FIG. 1B is a partial front view illustrating the Kelvin inspection IC socket 1 by partially cutting it away. In addition, FIG. 1C is a partial plan view of the Kelvin inspection IC socket 1. In addition, FIG. 2A is a partial cross-sectional view illustrating the Kelvin inspection IC socket 1 and the electronic component 2 (cross-sectional view taken along the line A2-A2 of FIG. 2B). In addition, FIG. 2B is a partial front view illustrating the Kelvin inspection IC socket 1 and the electronic component 2 by partially cutting them away.

As illustrated in FIGS. 1 and 2, in the Kelvin inspection IC socket 1, the pairs of probes 4 are arranged as many as the number of terminals 3 while coining into contact with the terminals 3 of the electronic component 2, and the probes 4 are respectively housed in probe receptacles 6 provided in a socket body 5 formed of an insulating resin material. Note that, similar to the pair of probes 103 of the prior art, one of the pair of probes 4 according to the present embodiment is a force contact probe for supplying an electric current, and the other probe 4 is a sense contact probe for monitoring a voltage. In addition, the socket body 5 is formed by injection molding or the like.

As illustrated in FIGS. 1 and 2, in the Kelvin inspection IC socket 1, a cylindrical tube 7 of the probe 4 is housed in the probe receptacle 6 of the socket body 5, and a part of the plunger 8 placed in a tip side of the probe 4 (the upper end side as a terminal 3 side of the electronic component 2) projects upward of the socket body 5. Note that, although the socket body 5 has a first socket body block 5A, a second socket body block 5B, and a third socket body block 5C by way of example, the invention is not limited thereto. Alternatively, the entire socket body 5 may also be divided into two blocks, four blocks, or more blocks.

As illustrated in FIGS. 1 to 3, the probe 4 has a cylindrical tube 7 formed of a conductive metal material, a plunger 8 formed of a conductive metal material and provided with a base end portion 10 assembled to one end side (upper end side) of the tube 7, a coil spring (spring member) 11 that biases the plunger 8 and the tube 7 upward (to the terminal 3 side of the electronic component 2) at all times, and an electrode contact member 14 formed of a conductive metal material and pressed to an electrode 13 on a board 12 by virtue of the spring force of the coil spring 11.

The base end portion 10 of the plunger 8 is caulked and fixed in the tube 7. In addition, the plunger 8 has a slider portion 16 slidably engaged with a plunger guide hole 15 formed in the socket body 5, which is prevented from rotating, and first and second positioning surfaces 17 and 18 whose vertical positions along a central axis 4a of the probe 4 are different.

By cutting a rounded bar member 20 from one end side of a radial direction toward the central axis 4a side and cutting the rounded bar member 20 from the other end side of the radial direction toward the central axis 4a side, a cross-sectional shape of the slider portion 16 of the plunger 8 perpendicular to the central axis 4a of the probe 4 (as seen in plan views of FIGS. 1C and 3D) is formed in a substantially rectangular shape, and a pair of side surfaces 21 extending from the tip side of the plunger 8 along the central axis 4a of the probe 4 are formed. Note that the slider portion 16 has a pair of parallel side surfaces 21 and a pair of curved surfaces 22 (a part of the outer surfaces of the rounded bar member 20) that connect the pair of parallel side surfaces 21 to each other.

The first positioning surface 17 of the plunger 8 is formed by cutting the rounded bar member 20 from one end side of the radial direction toward the central axis 4a side, and is positioned in the lower end of the one of the pair of side surfaces 21 of the slider portion 16. In addition, the second positioning surface 18 of the plunger 8 is formed by cutting the rounded bar member 20 from the other end side of the radial direction toward the central axis 4a side, and is positioned in the other lower end of the pair of side surfaces 21 of the slider portion 16. In addition, the second positioning surface 18 is placed farther from the tip 23 of the plunger 8 than the first positioning surface 17.

A tip surface 24 (upper end surface in FIGS. 1 to 3) of the slider portion 16 is sloped such that its vertical position is gradually reduced from one end side of the longitudinal direction (one curved surface 22 side) having a substantially rectangular shape in a plan view toward the other end side of the longitudinal direction (the other curved surface 22 side). In addition, an upper end side of the sloped surface of the tip surface 24 of the slider portion 16 is sharpened in a triangular shape, and a sharp vertex of the triangular shape becomes the tip 23 of the plunger 8. The tip 23 of the plunger 8 is placed at the upper edge of one curved surface 22 of the slider portion 16 in a central portion of the circumferential direction of the one curved surface 22, and is offset from the central axis 4a of the probe 4.

The pair of probes 4 having such a configuration have the same shape, and, in a projected shape onto a virtual plane perpendicular to the central axis 4a of the probe 4, they are housed in the probe receptacles 6 while one of the probes 4 is rotated by 180° with respect to the other probe 4. Therefore, the probes 4 are maintained in the correct posture in which the tips 23 of the plungers 8 are closest to each other (the tips 23 of the pair of plungers 8 are positioned back to back).

The plunger guide hole 15 of the socket body 5 is provided in the plunger guide portion 25 placed to block one end side of the probe receptacle 6 to form a part of the probe receptacle 6. In addition, as illustrated in FIG. 1C, the plunger guide hole 15 has a substantially rectangular shape similar to that of the slider portion 16 of the plunger 8 as seen in a plan view.

The probe receptacle 6 of the socket body 5 has a first abutting protrusion 26 (plunger projection amount restrictor) on which the first positioning surface 17 is abuttable and a second abutting protrusion 27 (plunger projection amount restrictor) on which the second positioning surface 18 is abuttable when the probe 4 is inserted in the correct posture. In addition, as illustrated in FIG. 1, the probe receptacle 6 projects the plunger 8 from the plunger guide hole 15 by a design dimension when the probe 4 is inserted in the correct posture. In addition, as illustrated in FIG. 4, the probe receptacle 6 is formed such that, when the probe 4 is inserted in an erroneous posture (in which the tips 23 of the plunger 8 are not positioned back to back), the first positioning surface 17 abuts on the second abutting protrusion 27, and the plunger 8 projects from the plunger guide hole 15 by an amount less than the design dimension. Note that, in the Kelvin inspection IC socket 1 according to the present embodiment, although the plunger 8 projects from the plunger guide hole 15 by an amount less than the design dimension when the probe 4 is inserted into the probe receptacle 6 in an erroneous posture by way of example as illustrated in FIG. 4, the invention is not limited thereto. Alternatively, the first and second positioning surfaces 17 and 27 may also be formed not to project the plunger 8 from the plunger guide hole 15.

Figure 5A:
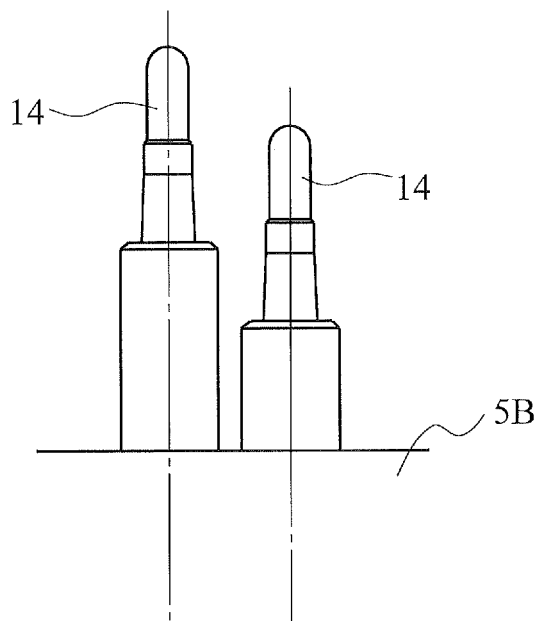
FIG. 5A is a partial front view illustrating the Kelvin inspection IC socket by partially cutting it away.
Figure 5B:
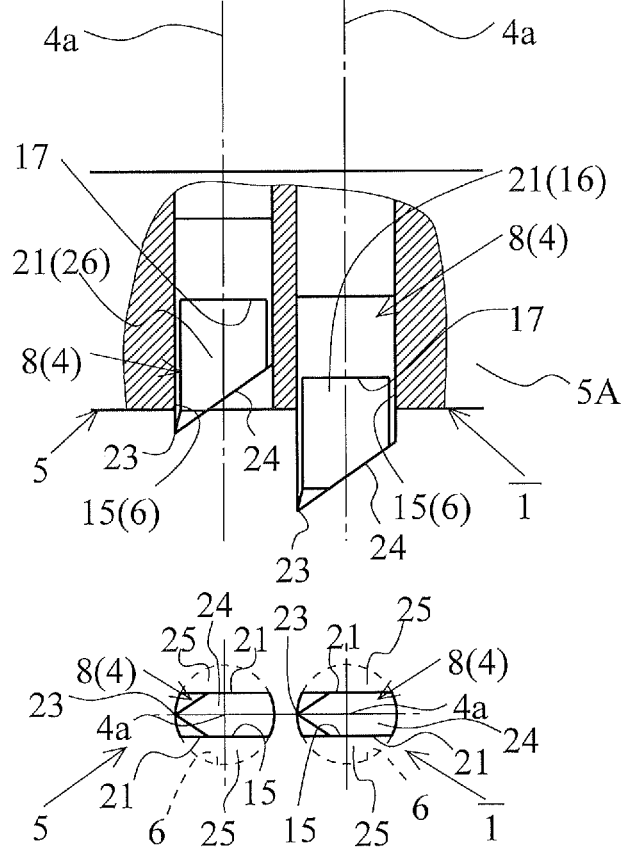
FIG. 5B is a partial plan view of the Kelvin inspection IC socket.

FIG. 5 is a diagram illustrating an assembled state of the Kelvin inspection IC socket 1, in which one of the pair of probes 4 is inserted into the probe receptacle 6 in an erroneous posture. As illustrated in FIG. 5, after the second socket body block 5B is assembled onto the first socket body block 5A, the pair of probes 4 are inserted into the probe receptacles 6 from the upper side of the second socket body block 5B. In this case, when one of the pair of probes 4 is inserted into the probe receptacle 6 of the second and first socket body blocks 5B and 5A in an erroneous posture with respect to the other probe 4, one of the tips 23 of the pair of probes 4 does not project from the probe receptacle 6, or the projection amount from the probe receptacle 6 becomes small. As a result, at the time of assembling the Kelvin inspection IC socket 1, one of the rear ends of the pair of probes 4 (electrode contact member 14) projects from the second socket body block 5B to be higher than the other rear end of the pair of probes 4 (electrode contact member 14), so that it is possible to make an operator recognize that one of the pair of probes 4 is inserted into the probe receptacle 6 in an erroneous posture and prevent the probe 4 from being erroneously assembled to the first and second socket body blocks 5A and 5B. In addition, in the Kelvin inspection IC socket 1, after all of the probes 4 are inserted into the probe receptacles 6 of the first and second socket body blocks 5A and 5B, the third socket body block 5C is assembled to the second socket body block 5B, so that the entire assembling work is completed. After the assembling is completed, the Kelvin inspection IC socket 1 is turned upside down and is installed on the board 12 for use (refer to FIG. 1).

Figures 20A, 20B:
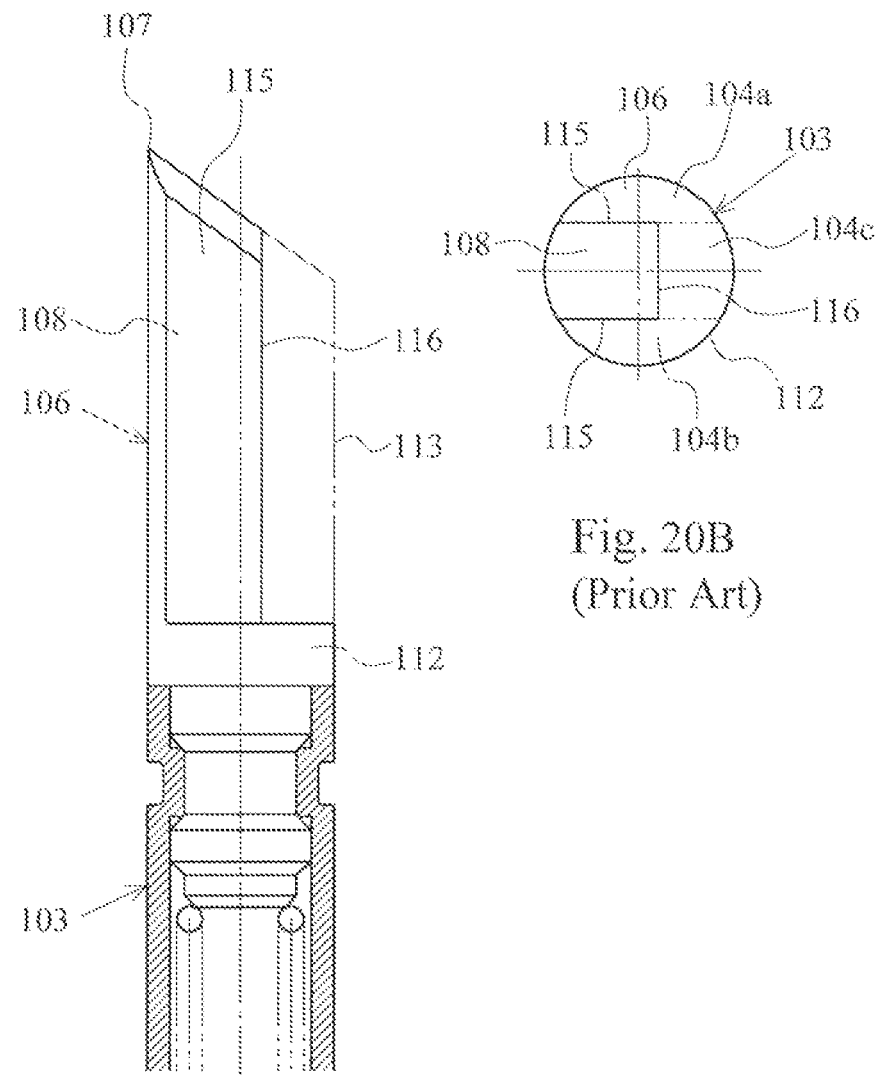
FIG. 20A is a side view illustrating the probe by partially cutting it away.
FIG. 20B is a plan view of the probe.
Figure 21A:
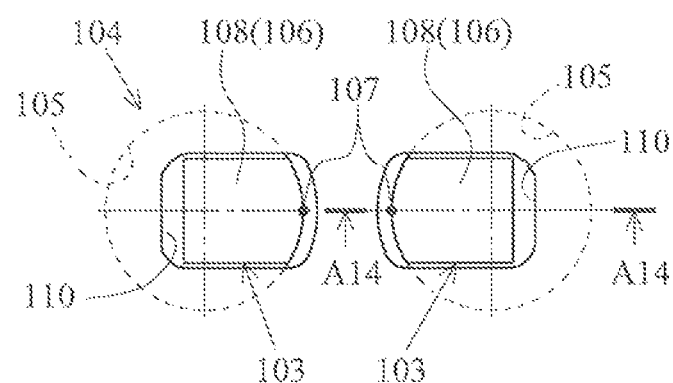
FIG. 21A is a partial plan view illustrating the Kelvin inspection IC socket in the example of the prior art of FIG. 19A.
Figure 21B:
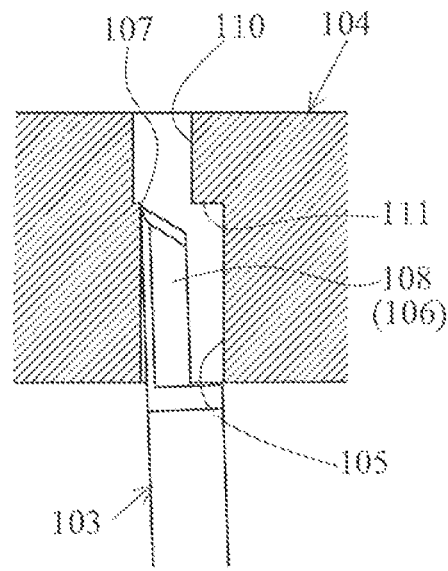
FIG. 21B is a diagram illustrating an insertion state of the probe into the probe receptacle.
Figure 22A:
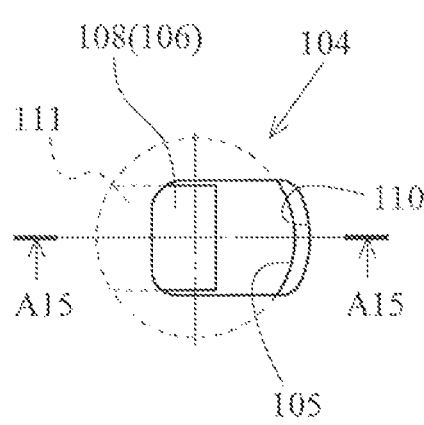
FIG. 22A is a plan view illustrating an erroneous probe insertion state of the Kelvin inspection IC socket in an example of the prior art.
Figure 22B:
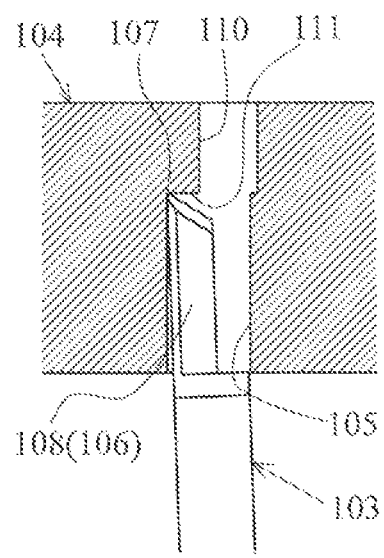
FIG. 22B is a diagram illustrating an erroneous insertion state of the probe into a probe insertion hole.

In the Kelvin inspection IC socket 1 according to the present embodiment having the aforementioned configuration, as compared with an example of the prior art in which three side surfaces 115, 115, and 116 of the plunger 106 are machined (refer to FIG. 20), two side surfaces 21 of the plunger 8 are machined. In addition, it is possible to prevent the probe 4 from being assembled to the probe receptacle 6 of the socket body 5 in an erroneous posture even when a fabrication workload for the side surface 21 of the plunger 8 is reduced. In this manner, in the Kelvin inspection IC socket 1 according to the present embodiment, since the fabrication workload for the side surface 21 of the plunger 8 is reduced as compared with the example of the prior art, it is possible to reduce the fabrication cost as compared with the example of the prior art.

Second Embodiment

Figure 7D:
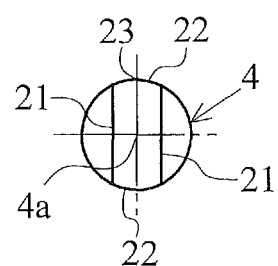
FIG. 7D is a plan view of the probe.
Figure 7C:
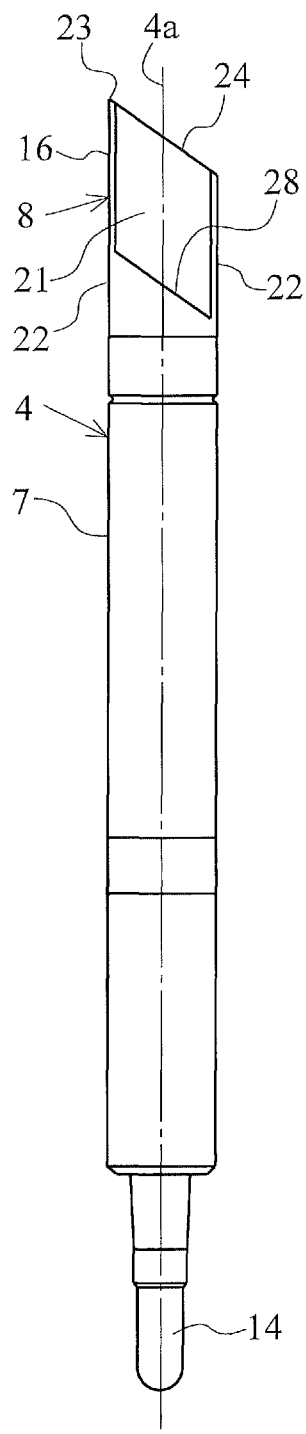
FIG. 7C is a left-side view of the probe.
Figure 7A:
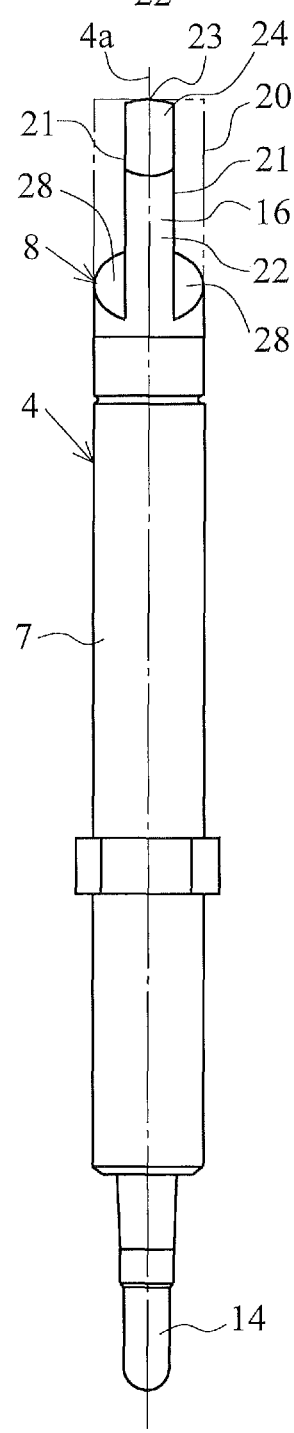
FIG. 7A is a front view of the probe.

FIG. 6 is a diagram illustrating a Kelvin inspection IC socket 1 according to a second embodiment of the present invention in contrast with FIG. 1. FIG. 7 is a diagram illustrating a probe 4 of the Kelvin inspection IC socket 1 according to the second embodiment of the present invention in contrast with FIG. 3. Note that, in the drawings illustrating the Kelvin inspection IC socket 1 according to the present embodiment, like reference symbols denote like elements as in FIG. 1 that shows the Kelvin inspection IC socket 1 of the first embodiment, and they will not be described repeatedly. In addition, in the drawings illustrating the probe 4 of the Kelvin inspection IC socket 1 according to the present embodiment, like reference symbols denote like elements as in FIG. 3 that shows the probe 4 of the Kelvin inspection IC socket 1 of the first embodiment, and they will not be described repeatedly.

As illustrated in FIGS. 6 and 7, in the Kelvin inspection IC socket 1 according to the present embodiment, the plunger 8 has a slider portion 16 slidably engaged with a plunger guide hole 15 provided in the socket body 5, which is prevented from rotating, and a pair of positioning slope surfaces 28 whose vertical positions along the central axis 4a of the probe 4 change.

By cutting a rounded bar member 20 from one end side of the radial direction toward the central axis 4a side and cutting the rounded bar member 20 from the other end side of the radial direction toward the central axis 4a side, a cross-sectional shape of the slider portion 16 of the plunger 8 perpendicular to the central axis 4a of the probe 4 is formed in a substantially rectangular shape, and a pair of side surfaces 21 extending from the tip 23 side of the plunger 8 along the central axis 4a of the probe 4 are formed. Note that the slider portion 16 has a pair of parallel side surfaces 21 and a pair of curved surfaces 22 (a part of the outer surfaces of the rounded bar member 20) that connect the pair of parallel side surfaces 21 to each other.

One of the pair of positioning slope surfaces 28 of the plunger 8 is formed by cutting the rounded bar member 20 from one end side of the radial direction toward the central axis 4a side, and is positioned in the lower end of one of the pair of side surfaces 21 of the slider portion 16. In addition, the other positioning slope surface 28 is formed by cutting the rounded bar member 20 from the other end side of the radial direction toward the central axis 4a side, and is positioned in the lower end of the other side surface 21 of the slider portion 16.

A tip surface 24 (upper end surface in FIG. 6) of the slider portion 16 is sloped such that its vertical position is gradually reduced from one end side of the longitudinal direction (one curved surface 22 side) having a substantially rectangular shape in a plan view toward the other end side of the longitudinal direction (the other curved surface 22 side). In addition, a vertex of the sloped surface of the tip surface 24 of the slider portion 16 becomes the tip 23 of the plunger 8. The tip 23 of the plunger 8 is placed at the upper edge of one curved surface 22 of the slider portion 16 in a central portion of the circumferential direction of the one curved surface 22, and is offset from the central axis 4a of the probe 4.

The pair of probes 4 having such a configuration have the same shape, and, in a projected shape onto a virtual plane perpendicular to the central axis 4a of the probe 4, they are housed in the probe receptacles 6 while one of the probes 4 is rotated by 180° with respect to the other probe 4. Therefore, the probes 4 are maintained in the correct posture in which the tips 23 of the plungers 8 are closest to each other (the tips 23 of the pair of plungers 8 are positioned back to back).

The plunger guide hole 15 of the socket body 5 is provided in the plunger guide portion 25 placed to block one end side of the probe receptacle 6 to form a part of the probe receptacle 6. In addition, as illustrated in FIG. 6C, the plunger guide hole 15 has a substantially rectangular shape similar to that of the slider portion 16 of the plunger 8 as seen in a plan view.

Figure 8A:
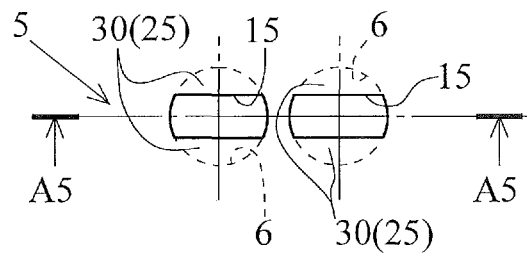
FIG. 8A is a plan view of the one end side of the probe receptacle.
Figure 8B:
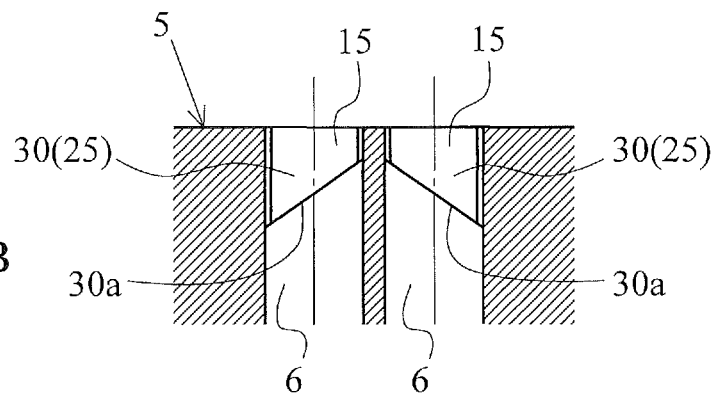
FIG. 8B is a cross-sectional view illustrating the probe receptacle taken along the line A5-A5 of FIG. 8A.
Figure 9A:
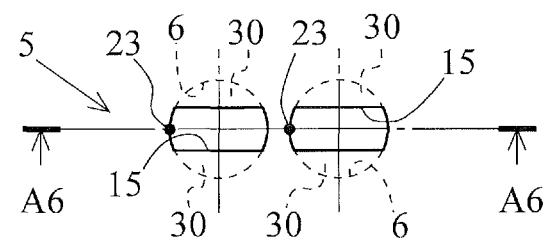
FIG. 9A is a partial plan view illustrating an erroneous probe insertion state of the Kelvin inspection IC socket.
Figure 9B:
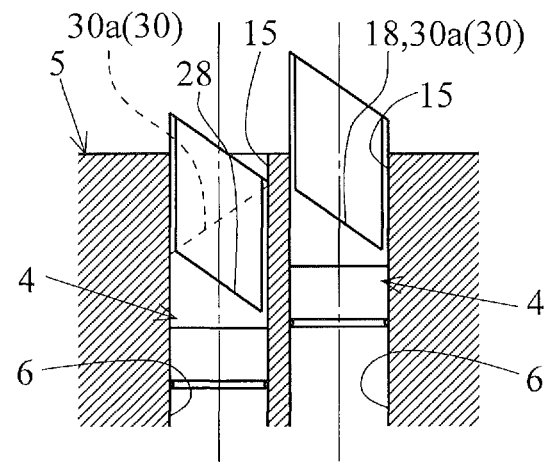
FIG. 9B is a cross-sectional view illustrating an erroneous probe insertion state of the Kelvin inspection IC socket (cross-sectional view taken along the line A6-A6 of FIG. 9A).

As illustrated in FIGS. 6 and 8, the probe receptacle 6 is provided with a pair of abutting protrusions (plunger projection amount restrictor) 30 having abutting slope surfaces 30a having the same slope angles as those of the pair of positioning slope surfaces 28 when the probe 4 is inserted in the correct posture. In addition, as illustrated in FIG. 6, the probe receptacle 6 is formed to project the plunger 8 from the plunger guide hole 15 by a design dimension when the probe 4 is inserted in the correct posture. In addition, as illustrated in FIG. 9, the probe receptacle 6 is formed such that the slope angles of the pair of positioning slope surfaces 28 become opposite to those of the abutting slope surfaces 30a when the probe 4 is inserted in an erroneous posture (in which the tips 23 of the plunger 8 are not positioned back to back), and, assuming that a position of the pair of positioning slope surfaces 28 closest to the tip 23 of the plunger 8 is the highest position of the pair of positioning slope surfaces 28, the highest position of the pair of positioning slope surfaces 28 abuts on the lowest position of the abutting slope surfaces 30a of the pair of abutting protrusions 30 to project the plunger 8 from the plunger guide hole 15 by an amount less than the design dimension. Note that, in the Kelvin inspection IC socket 1 according to the present embodiment, although the plunger 8 projects from the plunger guide hole 15 by an amount less than the design dimension when the probe 4 is inserted into the probe receptacle 6 in an erroneous posture by way of example as illustrated in FIG. 9, the invention is not limited thereto. Alternatively, the pair of positioning slope surfaces 8 and 28 and the pair of abutting protrusions 30 may also be formed not to project the plunger 8 from the plunger guide hole 15.

In the Kelvin inspection IC socket 1 according to the present embodiment described above, similar to the assembled state of the Kelvin inspection IC socket 1 according to the first embodiment illustrated in FIG. 5, when one of the pair of probes 4 is inserted into the probe receptacle 6 of the second and first socket body blocks 5B and 5A in an erroneous posture with respect to the other probe 4, one of the tips 23 of the pair of probes 4 does not project from the probe receptacle 6, or the projection amount from the probe receptacle 6 becomes small. As a result, at the time of assembling the Kelvin inspection IC socket 1, one of the rear ends of the pair of probes 4 (electrode contact member 14) projects from the second socket body block 5B to be higher than the other rear end of the pair of probes 4 (electrode contact member 14), so that it is possible to make an operator recognize that one of the pair of probes 4 is inserted into the probe receptacle 6 in an erroneous posture and prevent the probe 4 from being erroneously assembled to the first and second socket body blocks 5A and 5B.

In the Kelvin inspection IC socket 1 according to the present embodiment having the aforementioned configuration, as compared with an example of the prior art in which three side surfaces 115, 115, and 116 of the plunger 106 are machined (refer to FIG. 20), two side surfaces 21 of the plunger 8 are machined. In addition, it is possible to prevent the probe 4 from being assembled to the probe receptacle 6 of the socket body 5 in an erroneous posture even when a fabrication workload for the side surface 21 of the plunger 8 is reduced. In this manner, in the Kelvin inspection IC socket 1 according to the present embodiment, since the fabrication workload for the side surface 21 of the plunger 8 is reduced as compared with the example of the prior art, it is possible to reduce a fabrication cost as compared with the example of the prior art.

Third Embodiment

FIG. 10 is a diagram illustrating a Kelvin inspection IC socket 1 according to a third embodiment of the present invention in contrast with FIG. 1. FIG. 11 is a diagram illustrating a probe 4 of the Kelvin inspection IC socket 1 according to the third embodiment of the present invention in contrast with FIG. 3. Note that, in the drawings illustrating the Kelvin inspection IC socket 1 according to the present embodiment, like reference symbols denote like elements as in FIG. 1 that shows the Kelvin inspection IC socket 1 of the first embodiment, and they will not be described repeatedly. In addition, in the drawings illustrating the probe 4 of the Kelvin inspection IC socket 1 according to the present embodiment, like reference symbols denote like elements as in FIG. 3 that shows the probe 4 of the Kelvin inspection IC socket 1 of the first embodiment, and they will not be described repeatedly.

As illustrated in FIGS. 10 and 11, in the Kelvin inspection IC socket 1 according to the present embodiment, the plunger 8 has a slider portion 16 slidably engaged with a plunger guide hole 15 formed in the socket body 5, which is prevented from rotating, and a pair of positioning surfaces 31 that determine a projection amount of the probe 4 from the plunger guide hole 15.

By cutting a rounded bar member 20 from one end side of the radial direction toward the central axis 4a side and cutting the rounded bar member 20 from the other end side of the radial direction toward the central axis 4a side, a cross-sectional shape of the slider portion 16 of the plunger 8 perpendicular to the central axis 4a of the probe 4 is formed in a substantially rectangular shape, and a pair of side surfaces 21 extending from the tip 23 side of the plunger 8 along the central axis 4a of the probe 4 are formed. Note that the slider portion 16 has a pair of side surfaces 21 and a pair of curved surfaces 22a and 22b (a part of the outer surfaces of the rounded bar member 20) that connect the pair of side surfaces 21 to each other.

One of the pair of positioning surfaces 31 of the plunger 8 is formed by cutting the rounded bar member 20 from one end side of the radial direction toward the central axis 4a side, and is positioned in the lower end of one of the pair of side surfaces 21 of the slider portion 16. In addition, the other positioning surface 31 is formed by cutting the rounded bar member 20 from the other end side of the radial direction toward the central axis 4a side, and is positioned in the lower end of the other side surface 21 of the slider portion 16.

A tip surface 24 (upper end surface in FIG. 10) of the slider portion 16 is sloped such that its vertical position is gradually reduced from one end side of the longitudinal direction (one curved surface 22a side) having a substantially rectangular shape in a plan view toward the other end side of the longitudinal direction (the other curved surface 22b side). In addition, a vertex of the sloped surface of the tip surface 24 of the slider portion 16 becomes the tip 23 of the plunger 8. The tip 23 of the plunger 8 is placed at the upper edge of one curved surface 22a of the slider portion 16 in a central portion of the circumferential direction of the one curved surface 22a, and is offset from the central axis 4a of the probe 4.

The pair of probes 4 having such a configuration have the same shape, and, in a projected shape onto a virtual plane perpendicular to the central axis 4a of the probe 4, the probes 4 are housed in the probe receptacles 6 while one of the probes 4 is rotated by 180° with respect to the other probe 4. Therefore, the probes 4 are maintained in the correct posture in which the tips 23 of the plungers 8 are closest to each other (the tips 23 of the pair of plungers 8 are positioned back to back).

The plunger guide hole 15 of the socket body 5 is provided in the plunger guide portion 25 placed to block one end side of the probe receptacle 6 to form a part of the probe receptacle 6. In addition, as illustrated in FIG. 10C, the plunger guide hole 15 has a substantially triangular shape similar to that of the slider portion 16 of the plunger 8 as seen in a plan view.

Figure 12A:
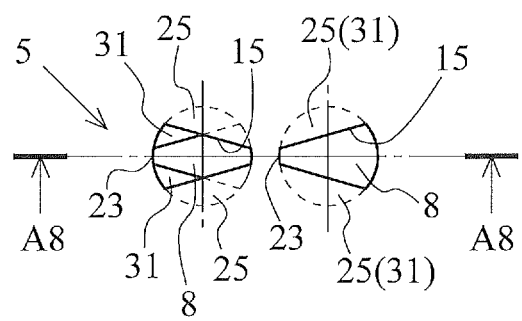
FIG. 12A is a partial plan view illustrating an erroneous probe insertion state of the Kelvin inspection IC socket.
Figure 12B:
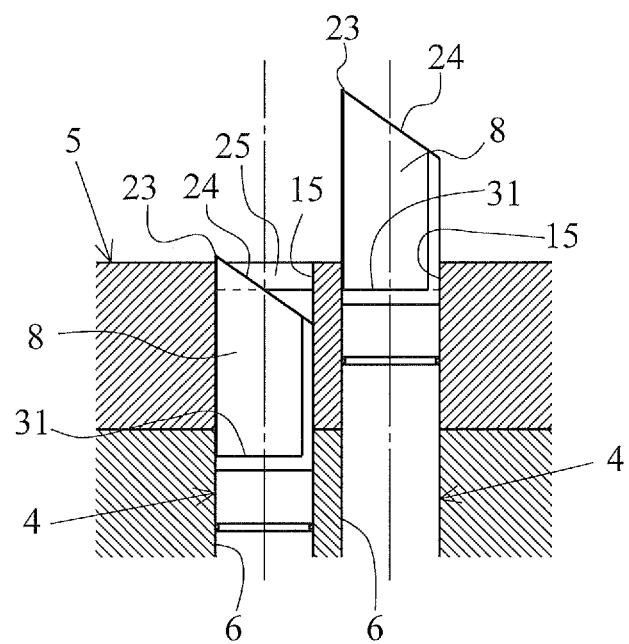
FIG. 12B is a cross-sectional view illustrating an erroneous probe insertion state of the Kelvin inspection IC socket (cross-sectional view taken along the line A8-A8 of FIG. 12A).

As illustrated in FIG. 10, the probe receptacle 6 is formed such that, when the probe 4 is inserted in the correct posture, the pair of positioning surfaces 31 abut on the plunger guide portions (plunger projection amount restrictor) 25 to project the plunger 8 from the plunger guide hole 15 by a design dimension. In addition, as illustrated in FIG. 12, the probe receptacle 6 is formed such that, when the probe 4 is inserted in an erroneous posture (in which the tips 23 of the plunger 8 are not positioned back to back), the tip 23 side of the plunger 8 abuts on the plunger guide portion (plunger projection amount restrictor) 25 to project the plunger 8 from the plunger guide hole 15 by an amount less than the design dimension. Note that, although FIG. 12 shows a configuration in which the plunger 8 projects from the plunger guide hole 15 by an amount less than the design dimension when the probe 4 is inserted into the probe receptacle 6 in an erroneous posture by way of example, the invention is not limited thereto. Alternatively, the thickness of the plunger guide portion 25 (the thickness along the central axis 4a of the probe 4) may also be set not to project the plunger 8 from the plunger guide hole 15.

In the Kelvin inspection IC socket 1 according to the present embodiment described above, similar to the assembled state of the Kelvin inspection IC socket 1 according to the first embodiment illustrated in FIG. 5, when one of the pair of probes 4 is inserted into the probe receptacle 6 of the second and first socket body blocks 5B and 5A in an erroneous posture with respect to the other probe 4, one of the tips 23 of the pair of probes 4 does not project from the probe receptacle 6, or the projection amount from the probe receptacle 6 becomes small. As a result, at the time of assembling the Kelvin inspection IC socket 1, one of the rear ends of the pair of probes 4 (electrode contact member 14) projects from the second socket body block 5B to be higher than the other rear end of the pair of probes 4 (electrode contact member 14), so that it is possible to make an operator recognize that one of the pair of probes 4 is inserted into the probe receptacle 6 in an erroneous posture and prevent the probe 4 from being erroneously assembled to the first and second socket body blocks 5A and 5B.

In the Kelvin inspection IC socket 1 according to the present embodiment having the aforementioned configuration, as compared with an example of the prior art in which three side surfaces 115, 115, and 116 of the plunger 106 are machined (refer to FIG. 20), two side surfaces 21 of the plunger 8 are machined. In addition, it is possible to prevent the probe 4 from being assembled to the probe receptacle 6 of the socket body 5 in an erroneous posture even when a fabrication workload for the side surface 21 of the plunger 8 is reduced. In this manner, in the Kelvin inspection IC socket 1 according to the present embodiment, since the fabrication workload for the side surface 21 of the plunger 8 is reduced as compared with the example of the prior art, it is possible to reduce a fabrication cost as compared with the example of the prior art.

Fourth Embodiment

FIG. 13 is a diagram illustrating a Kelvin inspection IC socket 1 according to a fourth embodiment of the present invention in contrast with FIG. 1. FIG. 14 is a diagram illustrating a probe 4 of the Kelvin inspection IC socket 1 according to the fourth embodiment of the present invention in contrast with FIG. 3. Note that, in the drawings illustrating the Kelvin inspection IC socket 1 according to the present embodiment, like reference symbols denote like elements as in FIG. 1 that shows the Kelvin inspection IC socket 1 of the first embodiment, and they will not be described repeatedly. In addition, in the drawings illustrating the probe 4 of the Kelvin inspection IC socket 1 according to the present embodiment, like reference symbols denote like elements as in FIG. 3 that shows the probe 4 of the Kelvin inspection IC socket 1 of the first embodiment, and they will not be described repeatedly.

As illustrated in FIGS. 13 and 14, in the Kelvin inspection IC socket 1 according to the present embodiment, the plunger 8 has a slider portion 16 slidably engaged with a plunger guide hole 15 formed in the socket body 5, which is prevented from rotating, and a positioning surface 32 that determines a projection amount of the probe 4 from the plunger guide hole 15.

By cutting a rounded bar member 20 from one end side of the radial direction to the central axis 4a, a cross-sectional shape of the slider portion 16 of the plunger 8 perpendicular to the central axis 4a of the probe 4 is formed in a semicircular shape, and a side surface (flat surface) 21 extending from the tip 23 side of the plunger 8 along the central axis 4a of the probe 4 is formed. Note that the slider portion 16 has a side surface (flat surface) 21 and a curved surface 22 (obtained by bisecting an outer circumferential surface of the rounded bar member 20 along the circumferential direction).

The positioning surface 32 of the plunger 8 is formed in the lower end side of the side surface 21 to be perpendicular to the central axis 4a of the probe 4 by cutting the rounded bar member 20 from one end side of the radial direction to the central axis 4a, and has a semicircular shape as seen in a plan view.

A tip surface 24 (upper end surface in FIG. 13) of the slider portion 16 is sloped such that its vertical position is gradually reduced from one end side of the radial direction having a semicircular shape in a plan view toward the other end side of the radial direction. In addition, a vertex of the sloped surface of the tip surface 24 of the slider portion 16 becomes the tip 23 of the plunger 8. The tip 23 of the plunger 8 is placed at one end side of the radial direction of the tip surface 24 having a semicircular shape in a plan view, and is offset from the central axis 4a of the probe 4.

The pair of probes 4 having such a configuration have the same shape, and, in a projected shape onto a virtual plane perpendicular to the central axis 4a of the probe 4, the probes 4 are housed in the probe receptacles 6 while one of the probes 4 is rotated by 180° with respect to the other probe 4. Therefore, the probes 4 are maintained in the correct posture in which the tips 23 of the plungers 8 are closest to each other (the tips 23 of the pair of plungers 8 are positioned back to back).

The plunger guide hole 15 of the socket body 5 is provided in the plunger guide portion 25 placed to block one end side of the probe receptacle 6 to form a part of the probe receptacle 6. In addition, as illustrated in FIG. 13C, the plunger guide hole 15 has a semicircular shape similar to that of the slider portion 16 of the plunger 8 as seen in a plan view.

As illustrated in FIG. 13, the probe receptacle 6 is formed such that the positioning surface 32 of the plunger 8 abuts on the plunger guide portion (plunger projection amount restrictor) 25, and the plunger 8 projects from the plunger guide hole 15 by a design dimension when the probe 4 is inserted in the correct posture. In addition, as illustrated in FIG. 15, the probe receptacle 6 is formed such that, when the probe 4 is inserted in an erroneous posture (in which the tips 23 of the plunger 8 are not positioned back to back), the tip 23 side of the plunger 8 abuts on the plunger guide portion (plunger projection amount restrictor) 25 to prevent the plunger 8 from projecting from the plunger guide hole 15.

In the Kelvin inspection IC socket 1 according to the present embodiment described above, similar to the assembled state of the Kelvin inspection IC socket 1 according to the first embodiment illustrated in FIG. 5, when one of the pair of probes 4 is inserted into the probe receptacle 6 of the second and first socket body blocks 5B and 5A in an erroneous posture with respect to the other probe 4, one of the tips 23 of the pair of probes 4 does not project from the probe receptacle 6. As a result, at the time of assembling the Kelvin inspection IC socket 1, one of the rear ends of the pair of probes 4 (electrode contact member 14) projects from the second socket body block 5B to be higher than the other rear end of the pair of probes 4 (electrode contact member 14), so that it is possible to make an operator recognize that one of the pair of probes 4 is inserted into the probe receptacle 6 in an erroneous posture and prevent the probe 4 from being erroneously assembled to the first and second socket body blocks 5A and 5B.

In the Kelvin inspection IC socket 1 according to the present embodiment having the aforementioned configuration, as compared with an example of the prior art in which three side surfaces 115, 115, and 116 of the plunger 106 are machined (refer to FIG. 20), one side surface 21 of the plunger 8 is machined. In addition, it is possible to prevent the probe 4 from being assembled to the probe receptacle 6 of the socket body 5 in an erroneous posture even when a fabrication workload for the side surface 21 of the plunger 8 is reduced. In this manner, in the Kelvin inspection IC socket 1 according to the present embodiment, since the fabrication workload for the side surface 21 of the plunger 8 is reduced as compared with the example of the prior art, it is possible to reduce a fabrication cost as compared with the example of the prior art.

Fifth Embodiment

Figure 17B:
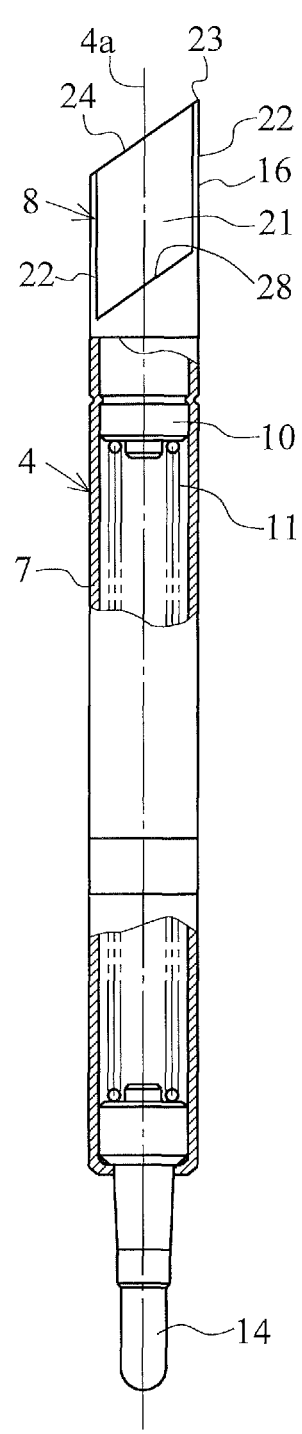
FIG. 17B is a right-side view illustrating the probe by partially cutting it away.

FIG. 16 is a diagram illustrating a Kelvin inspection IC socket 1 according to a fifth embodiment of the present invention, which is a modification of the Kelvin inspection IC socket 1 of FIG. 13. FIG. 17 is a diagram illustrating a probe 4 of the Kelvin inspection IC socket 1 according to the fifth embodiment of the present invention, which is a modification of the probe 4 of the Kelvin inspection IC socket 1 of FIG. 14. Note that, in the drawings illustrating the Kelvin inspection IC socket 1 according to the present embodiment, like reference symbols denote like elements as in FIG. 13 that shows the Kelvin inspection IC socket 1 of the fourth embodiment, and they will not be described repeatedly. In addition, in the drawings illustrating the probe 4 of the Kelvin inspection IC socket 1 according to the present embodiment, like reference symbols denote like elements as in FIG. 14 that shows the probe 4 of the Kelvin inspection IC socket 1 of the fourth embodiment, and they will not be described repeatedly.

A tip surface 24 (upper end surface in FIG. 16) of the slider portion 16 is sloped such that its vertical position is gradually reduced from a central position of the circumferential direction having a semicircular shape in a plan view toward the central axis 4a of the probe 4. In addition, a vertex of the sloped surface of the tip surface 24 of the slider portion 16 becomes the tip 23 of the plunger 8. The tip 23 of the plunger 8 is placed in the center of the circumferential direction of the tip surface 24 having a semicircular shape in a plan view, and is offset from the central axis 4a of the probe 4.

The pair of probes 4 having such a configuration have the same shape, and, in a projected shape onto a virtual plane perpendicular to the central axis 4a of the probe 4, the probes 4 are housed in the probe receptacles 6 while one of the probes 4 is rotated by 180° with respect to the other probe 4. Therefore, the probes 4 are maintained in the correct posture in which the tips 23 of the plungers 8 are closest to each other (the tips 23 of the pair of plungers 8 are positioned back to back).

The plunger guide hole 15 of the socket body 5 is provided in the plunger guide portion 25 placed to block one end side of the probe receptacle 6 to form a part of the probe receptacle 6. In addition, as illustrated in FIG. 16C, the plunger guide hole 15 has a semicircular shape similar to that of the slider portion 16 of the plunger 8 as seen in a plan view.

Figures 18A, 18B:
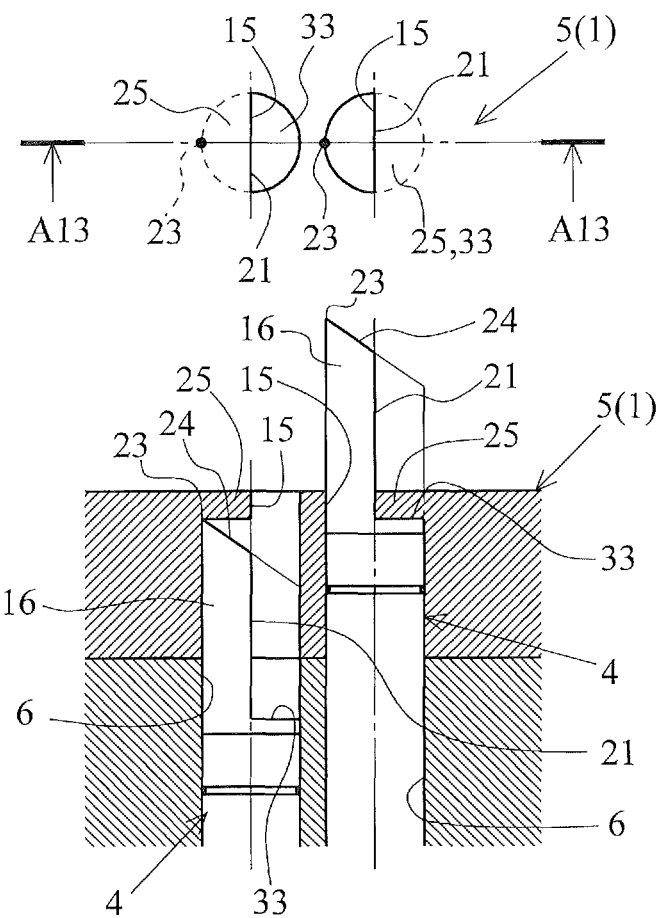
FIG. 18A is a partial plan view illustrating an erroneous probe insertion state of the Kelvin inspection IC socket.
FIG. 18B is a cross-sectional view illustrating an erroneous probe insertion state of the Kelvin inspection IC socket (cross-sectional view taken along the line A13-A13 of FIG. 18A).
Figures 19A, 19B:
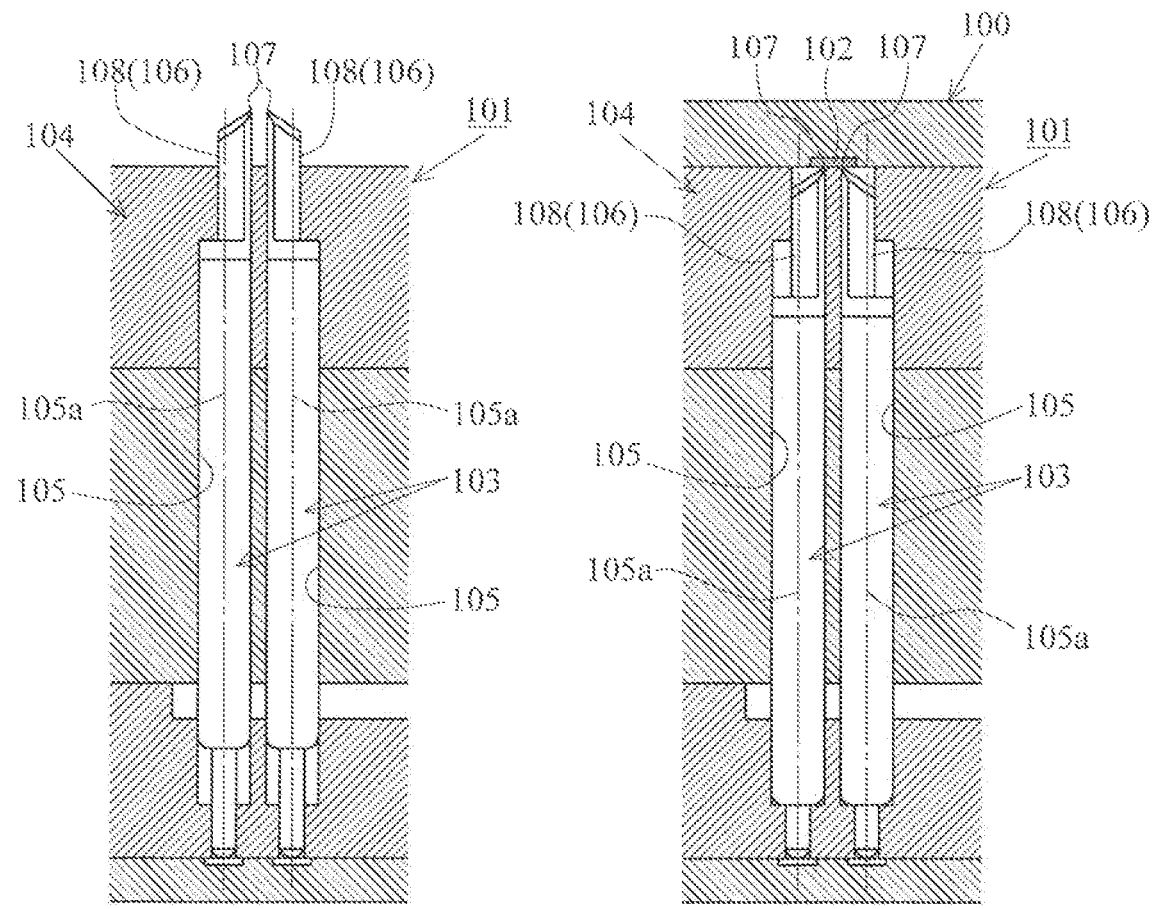
FIG. 19A is a partial cross-sectional view illustrating a Kelvin inspection IC socket in an example of the prior art.
FIG. 19B is a diagram illustrating a simplified relationship between the Kelvin inspection IC socket and the electronic component in an example of the prior art.

As illustrated in FIG. 16, the probe receptacle 6 is formed such that, when the probe 4 is inserted in the correct posture, the positioning surface 33 abuts on the plunger guide portion (plunger projection amount restrictor) 25 to project the plunger 8 from the plunger guide hole 15 by a design dimension. In addition, as illustrated in FIG. 18, the probe receptacle 6 is formed such that, when the probe 4 is inserted in an erroneous posture (in which the tips 23 of the plunger 8 are not positioned back to back), the tip 23 side of the plunger 8 abuts on the plunger guide portion (plunger projection amount restrictor) 25 to prevent the plunger 8 from projecting from the plunger guide hole 15.

In the Kelvin inspection IC socket 1 according to the present embodiment described above, similar to the assembled state of the Kelvin inspection IC socket 1 according to the first embodiment illustrated in FIG. 5, when one of the pair of probes 4 is inserted into the probe receptacle 6 of the second and first socket body blocks 5B and 5A in an erroneous posture with respect to the other probe 4, one of the tips 23 of the pair of probes 4 does not project from the probe receptacle 6. As a result, at the time of assembling the Kelvin inspection IC socket 1, one of the rear ends of the pair of probes 4 (electrode contact member 14) projects from the second socket body block 5B to be higher than the other rear end of the pair of probes 4 (electrode contact member 14), so that it is possible to make an operator recognize that one of the pair of probes 4 is inserted into the probe receptacle 6 in an erroneous posture and prevent the probe 4 from being erroneously assembled to the first and second socket body blocks 5A and 5B.

In the Kelvin inspection IC socket 1 according to the present embodiment having the aforementioned configuration, as compared with an example of the prior art in which three side surfaces 115, 115, and 116 of the plunger 106 are machined (refer to FIG. 20), one side surface 21 of the plunger 8 is machined. In addition, it is possible to prevent the probe 4 from being erroneously assembled to the probe receptacle 6 of the socket body 5 even when a fabrication workload for the side surface 21 of the plunger 8 is reduced. In this manner, in the Kelvin inspection IC socket 1 according to the present embodiment, since the fabrication workload for the side surface 21 of the plunger 8 is reduced as compared with the example of the prior art, it is possible to reduce a fabrication cost as compared with the example of the prior art.

Other Embodiments

While the Kelvin inspection IC socket has been described by way of example, the IC socket according to the present invention is not limited to the Kelvin inspection IC socket. Alternatively, one probe may be arranged for each terminal of the electronic component for a general burn-in test of the electronic component.

REFERENCE SIGNS AND NUMERALS

1 Kelvin inspection IC socket (IC socket),
2 electronic component,
3 terminal,
4 probe,
4a central axis,
5 socket body,
6 probe receptacle,
7 tube,
8 plunger,
11 coil spring (spring member),
15 plunger guide hole,
16 slider portion,
20 rounded bar member,
21 side surface,
23 tip,
25 plunger guide portion (plunger projection amount restrictor),
26 first abutting protrusion (plunger projection amount restrictor),
27 second abutting protrusion (plunger projection amount restrictor),
30 abutting protrusion (plunger projection amount restrictor)

The invention claimed is:

1. An IC socket used in an electrical test for an electronic component, comprising:
a probe configured to contact a terminal of the electronic component; and
a socket body having a probe receptacle formed to house the probe,
wherein the probe includes a tube housed in the probe receptacle of the socket body, and a plunger assembled to one end side of the tube and biased by a spring member housed in the tube such that a tip contacts the terminal of the electronic component,
the plunger has a slider portion slidably engaged with a plunger guide hole formed in the socket body, the slider portion being prevented from rotating,
the plunger guide hole is formed in a plunger guide portion placed to block one end side of the probe receptacle to form a part of the probe receptacle,
the slider portion has one side surface formed by cutting a rounded bar member from one end side of a radial direction toward a center side, the one side surface extending from a tip side of the plunger along a central axis of the probe, or a pair of side surfaces formed by cutting a rounded bar member from one end side of the radial direction and the other end side of the radial direction toward the center side, the pair of side surfaces extending from a tip side of the plunger along the central axis of the probe,
the one side surface of the slider portion or the pair of side surfaces of the slider portion are engaged with the plunger guide hole, and
the socket body has a plunger projection amount restrictor that abuts on the plunger to allow the plunger to project from the plunger guide hole by a design dimension when the probe is inserted into the probe receptacle in a correct posture, and abuts on the plunger to allow the plunger to project from the plunger guide by an amount greater than zero and less than the design dimension when the probe is inserted into the probe receptacle in an erroneous posture.

2. An IC socket used in an electrical test for an electronic component, comprising:
a pair of probes including a force contact probe and a sense contact probe configured to contact a terminal of the electronic component and having a same shape; and
a socket body having probe receptacles formed to house the probes,
wherein the probe includes a tube housed in the probe receptacle of the socket body and a plunger assembled to one end side of the tube and biased by a spring member housed in the tube such that a tip contacts the terminal of the electronic component, the plunger has a slider portion slidably engaged with a plunger guide hole formed in the socket body, the slider portion being prevented from rotating, the plunger having first and second positioning surfaces having different vertical positions along a central axis of the probe, the plunger guide hole is formed in a plunger guide portion placed to block one end side of the probe receptacle to form a part of the probe receptacle, the slider portion has a pair of side surfaces formed by cutting a rounded bar member from one end side of a radial direction toward a center side and cutting the rounded bar member from the other end side of the radial direction toward the center side, the pair of side surfaces having a substantially rectangular cross-sectional shape perpendicular to the central axis of the probe and extending from a tip side of the plunger along the central axis of the probe, the first positioning surface is formed by cutting the rounded bar member from one end side of the radial direction toward the center side and is placed on one of the pair of side surfaces of the slider portion, the second positioning surface is formed by cutting the rounded bar member from the other end side of the radial direction toward the center side and is placed on the other side surface of the slider portion farther from the tip of the plunger than the first positioning surface, the tip of the plunger is offset from the central axis of the probe, the pair of probes are housed in the probe receptacles while one of the probes is rotated by 180° with respect to the other probe in a projected shape onto a virtual plane perpendicular to the central axis of the probe, so that the probes are maintained in a correct posture in which the tips of the plungers are closest to each other, and the probe receptacle has a first abutting protrusion on which the first positioning surface is abuttable and a second abutting protrusion on which the second positioning surface is abuttable when the probe is inserted in a correct posture, the probe receptacle being formed such that the plunger projects from the plunger guide hole by a design dimension when the probe is inserted in the correct posture, and the first positioning surface abuts on the second abutting protrusion to prevent the plunger from projecting from the plunger guide hole or project the plunger by an amount less than the design dimension when the probe is inserted in an erroneous posture.

3. An IC socket used in an electrical test for an electronic component, comprising:

a pair of probes including a force contact probe and a sense contact probe configured to contact a terminal of the electronic component and having a same shape; and a socket body having probe receptacles formed to house the probes, wherein the probe includes a tube housed in the probe receptacle of the socket body and a plunger assembled to one end side of the tube and biased by a spring member housed in the tube such that a tip contacts the terminal of the electronic component, the plunger has a slider portion slidably engaged with a plunger guide hole formed in the socket body, the slider portion being prevented from rotating, the plunger having a pair of positioning slope surfaces whose vertical positions change along a central axis of the probe, the plunger guide hole is formed in a plunger guide portion placed to block one end side of the probe receptacle to form a part of the probe receptacle, the slider portion has a pair of side surfaces formed by cutting a rounded bar member from one end side of a radial direction toward a center side and cutting the rounded bar member from the other end side of the radial direction toward the center side, the pair of side surfaces having a substantially rectangular cross-sectional shape perpendicular to the central axis of the probe and extending from a tip side of the plunger along the central axis of the probe, in the pair of positioning slope surfaces, one of the pair of positioning slope surfaces is formed by cutting the rounded bar member from one end side of a radial direction to a center side and is placed in one of the pair of side surfaces of the slider portion, and the other positioning slope surface is formed by cutting the rounded bar member from the other end side of the radial direction to the center side and is placed in the other side surface of the slider portion, the tip of the plunger is offset from the central axis of the probe, the pair of probes are housed in the probe receptacles while one of the probes is rotated by 180° with respect to the other probe in a projected shape onto a virtual plane perpendicular to the central axis of the probe, so that the probes are maintained in a correct posture in which the tips of the plungers are closest to each other, and the probe receptacle has a pair of abutting protrusions having abutting slope surfaces having a same slope angle as those of the pair of positioning slope surfaces when the probe is inserted in a correct posture, the probe receptacle being formed such that the plunger projects from the plunger guide hole by a design dimension when the probe is inserted in the correct posture, and the pair of positioning slope surfaces and the abutting slope surfaces have opposite slope angles when the probe is inserted in an erroneous posture, so that, assuming that a position of the pair of positioning slope surfaces closest to the tip of the plunger is a highest position of the pair of positioning slope surfaces, the highest position of the pair of positioning slope surfaces abuts on a lowest position of the abutting slope surfaces of the pair of abutting protrusions to prevent the plunger from projecting the plunger guide hole or project the plunger by an amount less than the design dimension.

4. An IC socket used in an electrical test for an electronic component, comprising:

a pair of probes including a force contact probe and a sense contact probe configured to contact a terminal of the electronic component and having a same shape; and a socket body having probe receptacles formed to house the probes, wherein the probe includes a tube housed in the probe receptacle of the socket body and a plunger assembled to one end side of the tube and biased by a spring member housed in the tube such that a tip contacts the terminal of the electronic component, the plunger has a slider portion slidably engaged with a plunger guide hole formed in the socket body, the slider portion being prevented from rotating, the plunger having a pair of positioning surfaces that determine a projection amount of the probe from the plunger guide hole, the plunger guide hole is formed in a plunger guide portion placed to block one end side of the probe receptacle to form a part of the probe receptacle, the slider portion has a pair of side surfaces formed by cutting a rounded bar member from one end side of a radial direction toward a center side and cutting the rounded bar member from the other end side of the radial direction toward the center side, the pair of side surfaces having a substantially triangular cross-sectional shape perpendicular to the central axis of the probe and extending from a tip side of the plunger along the central axis of the probe, in the pair of positioning slope surfaces, one of the pair of positioning surfaces is formed by cutting the rounded bar member from one end side of a radial direction to a center side and is placed in one of the pair of side surfaces of the slider portion, and the other positioning surface is formed by cutting the rounded bar member from the other end side of the radial direction to the center side and is placed in the other side surface of the slider portion, the tip of the plunger is offset from the central axis of the probe, the pair of probes are housed in the probe receptacles while one of the probes is rotated by 180° with respect to the other probe in a projected shape onto a virtual plane perpendicular to the central axis of the probe, so that the probes are maintained in a correct posture in which the tips of the plungers are closest to each other, and the probe receptacle is formed such that the pair of positioning surfaces abut on the plunger guide portion to project the plunger from the plunger guide hole by a design dimension when the probe is inserted in a correct posture, and a tip side of the plunger abuts on the plunger guide portion to prevent the plunger from projecting from the plunger guide hole or project the plunger by an amount less than the design dimension when the probe is inserted in an erroneous posture.

5. An IC socket used in an electrical test for an electronic component, comprising:

a pair of probes including a force contact probe and a sense contact probe configured to contact a terminal of the electronic component and having a same shape; and a socket body having probe receptacles formed to house the probes, wherein the probe includes a tube housed in the probe receptacle of the socket body and a plunger assembled to one end side of the tube and biased by a spring member housed in the tube such that a tip contacts the terminal of the electronic component, the plunger has a slider portion slidably engaged with a plunger guide hole formed in the socket body, the slider portion being prevented from rotating, the plunger having a positioning surface that determines a projection amount of the probe from the plunger guide hole, the plunger guide hole is formed in a plunger guide portion placed to block one end side of the probe receptacle to form a part of the probe receptacle, the slider portion has a side surface formed by cutting a rounded bar member from one end side of the radial direction to a center, the side surface having a semicircular cross-sectional shape perpendicular to a central axis of the probe and extending half of the circumference of the plunger from a tip side of the plunger along the central axis of the probe, the positioning surface is formed in a lower end of the side surface by cutting the rounded bar member from one end side of the radial direction to the center, the tip of the plunger is offset from the central axis of the probe, the pair of probes are housed in the probe receptacles while one of the probes is rotated by 180° with respect to the other probe in a projected shape onto a virtual plane perpendicular to the central axis of the probe, so that the probes are maintained in a correct posture in which the tips of the plungers are closest to each other, and the probe receptacle is formed such that the pair of positioning surfaces abut on the plunger guide portion to project the plunger from the plunger guide hole by a design dimension when the probe is inserted in the correct posture, and a tip side of the plunger abuts on the plunger guide portion to prevent the plunger from projecting from the plunger guide hole when the probe is inserted in an erroneous posture.

* * * * *